(12) United States Patent
Gresset

(10) Patent No.: US 10,797,729 B2
(45) Date of Patent: Oct. 6, 2020

(54) POLAR-CODE BASED ENCODER AND METHOD FOR CONFIGURING DIVIDE AND CONQUER STRUCTURE OF POLAR-CODE BASED ENCODER

(71) Applicant: MITSUBISHI ELECTRIC CORPORATION, Tokyo (JP)

(72) Inventor: Nicolas Gresset, Rennes (FR)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/480,869

(22) PCT Filed: Mar. 9, 2018

(86) PCT No.: PCT/JP2018/010357
§ 371 (c)(1),
(2) Date: Jul. 25, 2019

(87) PCT Pub. No.: WO2018/169025
PCT Pub. Date: Sep. 20, 2018

(65) Prior Publication Data
US 2019/0393897 A1    Dec. 26, 2019

(30) Foreign Application Priority Data

Mar. 13, 2017    (EP) .................................... 17160554

(51) Int. Cl.
*H03M 13/13*    (2006.01)
*G06F 17/16*    (2006.01)
(Continued)

(52) U.S. Cl.
CPC ............ *H03M 13/13* (2013.01); *G06F 17/16* (2013.01); *G06F 17/18* (2013.01); *H03M 13/114* (2013.01); *H03M 13/2792* (2013.01)

(58) Field of Classification Search
CPC .............. H03M 13/13; H03M 13/114; H03M 13/2792; G06F 17/16; G06F 17/18
(Continued)

(56) References Cited

U.S. PATENT DOCUMENTS 10,659,194 B2 * 5/2020 Wang ..................... H04L 1/0057
10,666,389 B2 * 5/2020 Xu ......................... H04L 1/0072
10,666,392 B2 * 5/2020 Ge ......................... H04L 1/0058

OTHER PUBLICATIONS

Mahdavifar, "Fast Polarization and Finite-Length Scaling for Non-Stationary Channels", arxiv .org, Cornell University Library, 201 Olin Library Cornell University Ithaca, NY 14853, Nov. 14, 2016. XP080731432, total 12 pages.

(Continued)

*Primary Examiner* — Brian K Young
(74) *Attorney, Agent, or Firm* — Birch, Stewart, Kolasch & Birch, LLP

(57) ABSTRACT

A polar-code based encoder is used to perform a transfer of useful data to a polar-code based decoder via a Binary Discrete-input Memory-less Channel. The Divide and Conquer structure consists of a multiplexer having useful data bits and a set of frozen bits as inputs followed by a polarization block of size $N=2^L$, wherein the polarization block of size N comprises a set of front kernels followed by a shuffler and two complementary polarization sub-blocks of size N/2 with a similar structure as the polarization block of size N but with half its size. A dynamically configurable interleaver is present between the shuffler and one and/or the other of the complementary polarization sub-blocks at each recursion of the Divide and Conquer structure. The configuration of the dynamically configurable interleavers is dynamically modified according to changes detected in the Binary Discrete-input Memory-less Channel.

15 Claims, 12 Drawing Sheets

(51) Int. Cl.
*G06F 17/18* (2006.01)
*H03M 13/11* (2006.01)
*H03M 13/27* (2006.01)

(58) Field of Classification Search
USPC .......................................... 341/94, 106, 107
See application file for complete search history.

(56) References Cited

OTHER PUBLICATIONS

Trifonov et al., "Twisted Polar Codes", 2014 International Symposium on Information Theory and Its Applications, IEICE, Oct. 26, 2014, pp. 443-447, XP032702069.

\* cited by examiner

POLAR-CODE BASED ENCODER AND METHOD FOR CONFIGURING DIVIDE AND CONQUER STRUCTURE OF POLAR-CODE BASED ENCODER

TECHNICAL FIELD

The present invention generally relates to dynamically optimizing a Divide-and-Conquer structure of a data encoder, wherein said data encoder relies on a polar code encoding scheme. The present invention generally relates to dynamically defining a corresponding decoding behaviour.

BACKGROUND ART

Polar codes are linear block error correcting codes built from information theory considerations instead of relying on algebraic constructions. Polar codes are based on a Divide-and-Conquer (D&C) structure built of multi-branched recursions of a kernel, which transforms a physical channel into virtual outer channels. When the quantity of recursions becomes large, the virtual channels tend to either have high reliability or low reliability. In other words, the virtual channels polarize. Useful data bits, also referred to as information bits, are then allocated to the most reliable virtual channels and frozen bits are allocated to the remaining virtual channels.

Encoding and decoding complexity of polar codes is in the order of $N \cdot \log(N)$, where N is the size of the considered polar code. However, performance of polar codes is rather poor, compared to other coding techniques such as Turbo codes or LDPC (Low Density Parity Check) codes, when N is small, such as N=512. Moreover, polar codes shall be optimized for a given BDMC (Binary Discrete-input Memory-less Channel) onto which said polar codes are intended to be used.

In the following, we consider a system, consisting of an encoder 110 and a decoder 120, as schematically represented in FIG. 1. The encoder 110 generates codewords according to a polar code of size $N=2^L$, where L is the depth of the D&C structure of the polar code. In other words, N is a power of "2". The generated codewords are subject to a transfer to the decoder 120 via a BDMC 130. Such a transfer can be a wired transmission, or a wireless transmission, or an intermediate storage on a non-transitory information storage medium wherein the encoder 110 stores data on the non-transitory information storage medium and the decoder retrieves the data from the non-transitory information storage medium.

Let's denote $x_i$ the i-th entry of the vector x, and $x_{i:k}$ the vector of size (k-i+1) consisting of the entries $x_i$, $x_{i+1}$, ..., $x_k$ extracted from the vector x. Furthermore, let's denote $x_{i:j:k}$ the vector consisting of the entries $x_i$, $x_{i+j}$, ..., $x_{i+j\lfloor(k-i)/j\rfloor}$ extracted from the vector x, wherein $\lfloor u \rfloor$ represents the floor of u.

It is thus considered herein a polar code-based encoder of rate $R<1$, which converts a vector b of size N consisting of information bits and frozen bits into a codeword x of size N. It has to be noted that $N \cdot R$ information bits exists amongst the N entries of the vector b. It has then to be further noted that $N \cdot (1-R)$ frozen bits exists amongst the N entries of the vector b, and the positions and values of said frozen bits inside the vector b are known by design. Most of the time, the bits are set to the value "0" and their positions inside the vector b are represented by a vector F such that $F(i)=1$ if the bit at the i-th position in the vector b carries a frozen bit and such that $F(i)=0$ if the bit at the i-th position in the vector b carries an information bit.

Thus as shown in FIG. 2A, in order to apply the polar code, a first vector b' consisting of $N \cdot R$ information bits is converted by a multiplexor MUX 210, into a vector b of length N by inserting a quantity of $N \cdot (1-R)$ frozen bits according to the frozen bit positions defined by the vector F. The vector b is then processed by a polarizer (also referred to as polarization block) POL-N 220 of size N so as to encode the vector b into a codeword x of length N, which leads to a coding rate equal to R. The polarizer POL-N 220 represents the encoding part of the encoder 110.

A major aspect of polar code lies in the fact that the conversion from the vector b to the codeword x is static whatever the effective code rate R and effective characteristics of the considered BDMC, which means that the D&C structure of the polar code remains constant. Rate adaptation and performance optimization are then performed by adequately choosing the positions of the frozen bits in the vector b.

As shown in the modular architecture schematically represented in FIG. 2B, the polarizer POL-N 220 of size N is built from a couple of complementary polarizers of size N/2, namely an upper polarizer UPOL-N/2 271 of size N/2 and a lower polarizer LPOL-N/2 272 of size N/2. The upper polarizer UPOL-N/2 271 and the lower polarizer LPOL-N/2 272 have the same structure and are built like the polarizer POL-N 220 but with half its size. It means that each polarizer of size N/2 is built from two other polarizers of size N/4, and so on recursively, as far as reaching a couple of polarizers of size equal to "2" as shown in FIG. 2C. The Divide and Conquer structure is thus recursive with a depth equal to L, therefore defining L sub-polarization stages.

Let's consider that the vector b is input to the polarizer POL-N 220 of size N as shown in FIG. 2A. The vector b is processed by a set 250 of parallel kernels. Each kernel is itself a polarizer of size equal to "2" as shown in FIG. 2C. The bits of the vector b are grouped by pairs, each pair being input into a dedicated kernel. The N bits output by the set 250 of parallel kernels are then input into a shuffler 260 that distributes its odd entries toward the upper polarizer UPOL-N/2 271 and its even entries toward the lower polarizer LPOL-N/2 272. The shuffler 260 thus performs a shuffling operation Shuff that can be defined as follows:

$$x_{1:N}^{(2)} = \text{Shuff}(x_{1:N}^{(1)})$$

wherein the shuffling operation Shuff is more precisely as follows:

$$\forall\, 0 < i \le N/2, \begin{cases} x_i^{(2)} = x_{2i-1}^{(1)} \\ x_{i+N/2}^{(2)} = x_{2i}^{(1)} \end{cases}$$

wherein $x^{(1)}$ represents the vector that is input in the shuffler 260 and $x^{(2)}$ represents the corresponding vector output by the shuffler 260.

Let's denote InvShuff the operation that allows reverting the shuffling operation and that is defined as follows:

$$\text{InvShuff}(\text{Shuff}(x)) = x$$

As already mentioned, FIG. 2C schematically represents a polarizer 200 of size "2". Two bits $x_1^{(in)}$ and $x_2^{(in)}$ are input to the polarizer. Two bits $x_1^{(out)}$ and $x_2^{(out)}$ are output from the polarizer. The polarizer performs a polarization operation such that $x_1^{(out)}$ and $x_2^{(out)}$ are defined as follows:

$$\begin{cases} x_1^{(out)} = x_1^{(in)} \oplus x_2^{(in)} \\ x_2^{(out)} = x_2^{(in)} \end{cases}$$

wherein ⊕ represents the XOR function.

Let $I(x_1^{(out)}; y)$ be mutual information between the bit $x_1^{(out)}$ and a channel observation vector y. Let also $I(x_2^{(out)}; y)$ be mutual information between the bit $x_2^{(out)}$ and the channel observation vector y. Let also $I(x_1^{(in)}; y)$ be mutual information between the bit $x_1^{(in)}$ and the channel observation vector y. Let also $I(x_2^{(in)}; y|x_1^{(in)})$ be the mutual information between the bit $x_2^{(in)}$ and the channel observation vector y knowing the bit $x_1^{(in)}$. As a result of the polarization operation, the following relationship exists:

$$I(x_1^{(in)};y)+I(x_2^{(in)};y|x_1^{(in)})=I(x_1^{(out)};y)+I(x_2^{(out)};y)$$

which means capacity conservation is guaranteed by the polarization operation.

An exemplary algorithm implemented by the polarizer POL-N 220 for performing the aforementioned recursions is schematically shown in FIG. 3.

In a step S301, the polarizer POL-N 220 executes a call for performing a recursive computation for data $x_{1:n}^{(in)}$, with n being a power of "2" such that $2 \leq n \leq N$, so as to get $x_{1:n}^{(out)}$. At the very first recursion the call relates to a recursive computation for data $x_{1:N}^{(in)}$, so as to get $x_{1:N}^{(out)}$.

In a following step S302, the polarizer POL-N 220 checks whether n is equal to "2". If n is equal to "2", a step S303 is performed; otherwise, a step S304 is performed.

In the step S303, the polarizer POL-N 220 performs the following operations, for getting the two output values of the kernel thus considered:

$$\begin{cases} x_1^{(out)} = x_1^{(in)} \oplus x_2^{(in)} \\ x_2^{(out)} = x_2^{(in)} \end{cases}$$

Then a step S308 is performed.

In the step S304, the polarizer POL-N 220 performs the following operations, for getting the output values of the parallel kernels thus considered (n>2):

$$\begin{cases} x'^{(out)}_{1:2:n} = x^{(in)}_{1:2:n} \oplus x^{(in)}_{2:2:n} \\ x'^{(out)}_{2:2:n} = x^{(in)}_{2:2:n} \end{cases}$$

wherein $x'^{(out)}_{1:n}$ corresponds to the n outputs of the parallel kernels in use for the size n of the considered sub-polarization stage of the polarizer POL-N 220, which thus means that $x'^{(out)}_{1:2:n}$ corresponds to the odd outputs among the n outputs of said parallel kernels and $x'^{(out)}_{2:2:n}$ corresponds to the even outputs among the n outputs of said parallel kernels.

In a following step S305, the polarizer POL-N 220 applies the shuffling operation Shuff onto the outputs $x'^{(out)}_{1:n}$ of said parallel kernels so as to obtain outputs $x''^{(out)}_{1:n}$ of said shuffling operation Shuff.

In a following step S306, the polarizer POL-N 220 calls the recursive computation for the data $x''^{(out)}_{1:n/2}$ so as to get the outputs $x_{1:n/2}^{(out)}$ of the polarizer POL-N 220. It means that the algorithm of FIG. 3 is then recursively executed with a polarization size of n/2 onto the data $x''^{(out)}_{1:n/2}$.

In a following step S307, the polarizer POL-N 220 calls the recursive computation for the data $x''^{(out)}_{n/2+1:n}$ so as to get the outputs $x_{n/2+1:n}^{(out)}$ of the polarizer POL-N 220. It means that the algorithm of FIG. 3 is then recursively executed with a polarization size of n/2 onto the data $x''^{(out)}_{n/2+1:n}$. Then the step S308 is performed.

It has to be noted that the steps S306 and S307 may be inverted or executed in parallel.

In the step S308, the polarizer POL-N 220 returns the output values $x_{1:n}^{(out)}$ to the call started to be executed in the step S301, which ends the algorithm of FIG. 3 for the considered recursion.

Appropriately selecting the respective positions of the frozen bits according to the D&C structure of the polar code is crucial for achieving good decoding performance. Indeed, the polarizer POL-N 220 converts a set of parallel effective BDMCs of same nature and equal characteristics into an equivalent set of parallel virtual BDMCs of unequal nature and characteristics. In other words, by including the polarizer POL-N 220 within a model of the effective BDMC, an equivalent channel can be defined, via which the aforementioned vector b is considered to be transferred.

In general, the mutual information I(x'; y') of a BDMC with input x', output y' (i.e. observations), and probability function P(y'|x') characterizing channel transitions probabilities, is defined as follows:

$$I(x';y')=1-E_L \cdot [\log_2(1+e^{-L'})]$$

where $E_L[\ ]$ represents the mathematical expectation over the random variable L' called Log Likelihood Ratio (LLR) and defined as follows:

$$L'=\log(P(y'|x'))$$

wherein P(y'|x') and P(y'|x') both depend on the input bits and output channel observations.

Thus, the mutual information of a BDMC depends on the transition probability P(y'Åx'), which is a probability function p of at least one parameter of said BDMC, as it will be illustrated hereafter with binary erasure and additive white Gaussian noise channels examples of BDMCs. Equivalently, the mutual information of a BDMC is characterized by the LLR values probability distribution, which can be computed from the probability function p. In other words, the probability function p is associated with the BDMC to which x' is an input and L' is observations LLR.

Let $L_1^{(in)}, L_2^{(in)}, L_1^{(out)}, L_2^{(out)}$ be respectively the LLR values associated to the observation vector y and the bits $x_1^{(in)}, x_2^{(in)}, x_1^{(out)}, x_2^{(out)}$. Thus the two following equations hold:

$$L_1^{(in)}=2 \cdot a \tan h(\tan h(L_1^{(out)}/2) \cdot \tan h(L_2^{(out)}/2))$$

$$L_2^{(in)}=L_1^{(out)}+L_2^{(out)}$$

Thus, at any sub-polarization stage of the D&C structure of the polar code, each kernel has inputs $x_1^{(in)}$ and $x_2^{(in)}$; and outputs $x_1^{(out)}$ and $x_2^{(out)}$. According to the initial observation vector, LLR values can be computed and propagated using the above relationships. Thus, each input or output of any kernel is associated with a given LLR random variable corresponding to an equivalent BDMC with an associated probability function, being the channel transitions probabilities of said equivalent channel.

Considering that $p_1^{(in)}$ is the probability function p associated with the equivalent BDMC with $x_1^{(in)}$ as x' and LLR $L_1^{(in)}$ as L', that $p_2^{(in)}$ is the probability function p associated with the equivalent BDMC with $x_2^{(in)}$ as x' and $L_2^{(in)}$ as L', that $p_1^{(out)}$ is the probability function p associated with the equivalent BDMC with $x_1^{(out)}$ as x' and $L_1^{(out)}$ as L', that $p_2^{(out)}$ is the probability function p associated with the equivalent BDMC with $x_2^{(out)}$ as x' and $L_2^{(out)}$ as L', the probability functions $p_1^{(in)}$ and $p_2^{(in)}$ can be obtained from the probability functions $p_1^{(out)}$ and $p_2^{(out)}$, for instance analytically when possible or by using a Monte-Carlo simulation otherwise. Therefore, the probability functions $p_1^{(in)}$ and $p_2^{(in)}$ can be expressed as follows:

$$p_1^{(in)} = \mathcal{F}_1(p_1^{(out)}, p_2^{(out)})$$

$$p_2^{(in)} = \mathcal{F}_2(p_1^{(out)}, p_2^{(out)})$$

In other words, the functions $\mathcal{F}$ and $\mathcal{F}$ depend on the effective BDMC in use.

According to a first example, the BDMC is a Binary Erasure Channel (BEC) modelled by relying on erasure rate as parameter. Any channel observation $y_i$ is equal to $x_i$ with a probability $(1-\varepsilon_i)$ and is erased (which means that no observation is available) with a probability $\varepsilon_i$. Thus the probability function of a BEC is a conditional probability mass function defined by an erasure rate parameter. The channel is characterized by the transition probability function $p_i$ being the likelihood function and a function of the parameter $\varepsilon_i$ of the BEC channel, such that $$p_i(\varepsilon_i) = P(y_i|x_i) = 1\varepsilon_i.$$

The mutual information of the BEC thus depends on the transition probability function $P(y_i|x_i)$, and can be reduced to a function of the erasure rate $\varepsilon_i$.

It then means, at kernel level, that:

$$I(x_1^{(out)}; y) = 1 - \varepsilon_1$$

$$I(x_2^{(out)}; y) = 1 - \varepsilon_2$$

which implies that:

$$I(x_1^{(in)}; y) = (1-\varepsilon_1)(1-\varepsilon_2)$$

$$I(x_2^{(in)}; y|x_1^{(in)})) = 1 - \varepsilon_1\varepsilon_2$$

Therefore, regarding $x_1^{(in)}$, the equivalent channel is a BEC with erasure rate parameter equal to $1-(1-\varepsilon_1)(1-\varepsilon_2)$. In addition, regarding $x_2^{(in)}$, the equivalent channel is a BEC with erasure rate parameter equal to $\varepsilon_1\varepsilon_2$. In other words, under these circumstances:

$$\mathcal{F}_1'(p_1^{(out)}, p_2^{(out)}) = 1 - (1-\varepsilon_1)(1-\varepsilon_2)$$

$$\mathcal{F}_2'(p_1^{(out)}, p_2^{(out)}) = \varepsilon_1\varepsilon_2$$

wherein the functions $\mathcal{F}_1'(p_1^{(out)}, p_2^{(out)})$ and $\mathcal{F}_2'(p_1^{(out)}, p_2^{(out)})$ aim at obtaining the erasure rate of the equivalent channels from the probabilities $p_1^{(out)}$ and $p_2^{(out)}$, which allow to get the transition probabilities functions $p_1^{(in)}$ and $p_2^{(in)}$. As previously said, the probability function $p_i^{(out)}$ the transition probability $P(y|x_i^{(out)})$ and equal to one minus the erasure rate $\varepsilon_i$ of the BEC channel. Thus, finally the following relationships are defined for the functions $\mathcal{F}_1$ and $\mathcal{F}_2$:

$$p_1^{(in)} = \mathcal{F}_1(p_1^{(out)}, p_2^{(out)}) = p_1^{(out)} \times p_2^{(out)}$$

$$p_2^{(in)} = \mathcal{F}_2(p_1^{(out)}, p_2^{(out)})$$

According to a second example, the BDMC is an Additive White Gaussian Noise (AWGN) channel over which a Binary Phase Shift Keying (BPSK) modulation is used and modelled by relying on Signal-to-Noise Ratio (SNR) $\rho$ as parameter.

The BPSK modulation converts a bit equal to '0' into a symbol equal to '−1' and a bit equal to '1' into a symbol equal to '−1'. Thus, if the bit value is $x_i$, then the symbol value is $(2x_i - 1)$. The channel is characterized by the transition probability function $p_i$ being the likelihood function and a function of the parameter $\rho_i$ of the AWGN channel with BPSK input, such that $$p_i(\rho_i) = P(y_i|x_i) = \frac{\rho_i}{\sqrt{2\pi}} \exp\left(-\frac{\rho_i|y_i - (2x_i - 1)|^2}{2}\right)$$

As a result, at kernel level:

$$\begin{cases} L_1^{(out)} = (-1)^{x_1^{(out)}} \cdot 4 \cdot \rho_1^{(out)} \cdot y_1 \\ L_2^{(out)} = (-1)^{x_2^{(out)}} \cdot 4 \cdot \rho_2^{(out)} \cdot y_2 \end{cases}$$

wherein $L_1^{(out)}$ and $L_2^{(out)}$ are thus Gaussian random variables, and wherein $\rho_1^{(out)}$ and $\rho_2^{(out)}$ are SNR parameters of the BDMCs providing respectively observations $y_1$ and $y_2$.

The mutual information of the AWGN BDMC depends on the transition probability function, and can be reduced to a function of the signal to noise ratio only.

The mutual information of the AWGN BDMC with BPSK input has a value for each SNR parameter value $\beta$, which characterizes an upper bound on the data rate, between '0' and '1', that can be transmitted on said BDMC. It is understood that the data rate is bounded by '1', which is the spectral efficiency of the BPSK modulation when the information is not encoded, i.e. when the coding rate is equal to '1'. In practice, the mutual information gives indication on which coding rate of an error correcting code should be chosen for transmission at a given SNR $\beta$.

Thus, we can define $\mathcal{J}_g(\beta)$ as the function providing the value of the mutual information of the AWGN BDMC for a given signal to noise ratio $\beta$, which is either known in closed form or known from experiments and tabulations, then the following applies:

$$\begin{cases} I(x_1^{(out)}; y) = \mathcal{J}_g(\rho_1^{(out)}) \\ I(x_2^{(out)}; y) = \mathcal{J}_g(\rho_2^{(out)}) \end{cases}$$

Furthermore, $L_2^{(in)} = L_1^{(out)} + L_2^{(out)}$ is Gaussian distributed too, which involves that the equivalent BDMC with input $x_2^{(in)}$ is Gaussian when relying on parameter $\rho_2^{(in)}$ defined as follows:

$$\rho_2^{(in)} = \rho_1^{(out)} + \rho_2^{(out)}$$

Thus, the mutual information of the Gaussian equivalent BDMC associated with input $x_2^{(in)}$ can be expressed as follows:

$$I(x_2^{(in)}; y) = \mathcal{J}_g(\rho_1^{(out)} + \rho_2^{(out)})$$

It can be noticed that, due to capacity conservation property of the polarization operation:

$$I(x_1^{(in)}; y) = I(x_1^{(out)}; y) + I(x_2^{(out)}; y) - I(x_2^{(in)}; y|x_1^{(in)})$$

which means that:

$$I(x_1^{(in)}; y) = \mathcal{J}_g(\rho_1^{(out)}) + \mathcal{J}_g(\rho_2^{(out)}) - \mathcal{J}_g(\rho_1^{(out)} + \rho_2^{(out)})$$

It can further be noticed that $L_1^{(in)}$ does not lead to a Gaussian equivalent BDMC and that a Gaussian approximation is preferably used for computation simplicity considerations, therefore an equivalent BDMC for $x_1^{(in)}$ can be obtained with parameter $\rho_1^{(in)}$ defined as follows:

$$\rho_1^{(in)} = \mathcal{J}_g^{-1}(\mathcal{J}_g(\rho_1^{(out)}) + \mathcal{J}_g(\rho_2^{(out)}) - \mathcal{J}_g(\rho_1^{(out)} + \rho_2^{(out)}))$$

wherein $\mathcal{J}_g^{-1}$ is the inverse function of $\mathcal{J}_g$, which can be obtained through function tabulations.

Therefore, regarding $x_1^{(in)}$, the equivalent channel is an AWGN channel with SNR parameter equal to $\rho_1^{(in)}$ defined as above. In addition, regarding $x_2^{(in)}$, the equivalent channel is an AWGN channel with SNR parameter equal to $\rho_2^{(in)}$ defined as above. In other words, under these circumstances:

$$\mathcal{F}_1'(p_1^{(out)}, p_2^{(out)}) = \mathcal{J}_g^{-1}(\mathcal{J}_g(\rho_1^{(out)}) + \mathcal{J}_g(\rho_2^{(out)}) - \mathcal{J}_g(\rho_1^{(out)} + \rho_2^{(out)}))$$

$$\mathcal{F}_2'(p_1^{(out)}, p_2^{(out)}) = \rho_1^{(out)} + \rho_2^{(out)}$$

The functions $\mathcal{F}_1'(p_1^{(out)}, p_2^{(out)})$ and $\mathcal{F}_2'(p_1^{(out)}, p_2^{(out)})$ thus aim at obtaining the SNR of the equivalent BDMCs, which allow obtaining the transition probabilities $p_1^{(in)}$ and $p_2^{(in)}$.

Thus, finally the following relationships apply for the functions $\mathcal{F}_1$ and $\mathcal{F}_2$:

$$p_1^{(in)} = \mathcal{F}_1(p_1^{(out)}, p_2^{(out)}) = \frac{\mathcal{F}_1'(p_1^{(out)}, p_2^{(out)})}{\sqrt{2\pi}} \exp\left(-\frac{\mathcal{F}_1'(p_1^{(out)}, p_2^{(out)}) \cdot |y - (2x-1)|^2}{2}\right)$$

$$p_2^{(in)} = \mathcal{F}_2(p_1^{(out)}, p_2^{(out)}) = \frac{\mathcal{F}_2'(p_1^{(out)}, p_2^{(out)})}{\sqrt{2\pi}} \exp\left(-\frac{\mathcal{F}_2'(p_1^{(out)}, p_2^{(out)})|y - (2x-1)|^2}{2}\right)$$

As expressed above, probability functions enable computing the mutual information of the equivalent BDMCs. The D&C structure of the polarizer POL-N 220 allows guaranteeing independence of random variables between two inputs or two outputs of each kernel, thus the probability functions computation can be propagated throughout all the D&C structure of the polarizer POL-N 220, hence enabling computing the probability functions $p_{1:N}^{(in)}$ for the equivalent BDMC at the input of the polarizer POL-N 220 as a function of the probability functions $p_{1:N}^{(out)}$ of the effective BDMC used for performing the transfer and considered at the output of the polarizer POL-N 220.

From what precedes, the algorithm for probability functions propagation schematically shown in FIG. 2D can be drawn and then used for deciding frozen bits positions.

In a step S291, the polarizer POL-N 220 executes a call for performing a recursive computation for the probability functions $p_{1:n}^{(out)}$, with n being a power of "2" such that $2 \leq n \leq N$, so as to get the probability functions $p_{1:n}^{(in)}$. At the very first recursion the call relates to a recursive computation for the probability functions $p_{1:N}^{(out)}$, so as to get the probability functions $p_{1:N}^{(in)}$.

In a following step S292, the polarizer POL-N 220 checks whether n is equal to "2". If n is equal to "2", a step S293 is performed; otherwise, a step S294 is performed.

In the step S293, the polarizer POL-N 220 performs the following operations, for getting the probability functions $p_1^{(in)}$ and $p_2^{(in)}$ thus considered:

$$\begin{cases} p_1^{(in)} = \mathcal{F}_1(p_1^{(out)}, p_2^{(out)}) \\ p_2^{(in)} = \mathcal{F}_2(p_1^{(out)}, p_2^{(out)}) \end{cases}$$

Then a step S298 is performed.

In the step S294, the polarizer POL-N 220 calls the recursive computation for the probability functions $p_{1:n/2}^{(out)}$ so as to get intermediate probability functions $p'_{1:n/2}$. It means that the algorithm of FIG. 2D is then recursively executed with a polarization size of n/2 onto the data $p_{1:n/2}^{(out)}$.

In a following step S295, the polarizer POL-N 220 calls the recursive computation for the probability functions $p_{n/2+1:n}^{(out)}$ so as to get intermediate probability functions $p'_{n/2+1:n}$. It means that the algorithm of FIG. 2D is then recursively executed with a polarization size of n/2 onto the data $p_{n/2+1:n}^{(out)}$.

It has to be noted that the steps S294 and S295 may be inverted or executed in parallel.

In a following step S296, the polarizer POL-N 220 applies the inverse of the shuffling operation InvShuff onto the intermediate probability functions $p'_{1:n}$ so as to obtain intermediate probability functions relative to the outputs of the considered parallel kernels.

In a following step S297, the polarizer POL-N 220 computes the following:

$$\forall\, 0 < i \leq n/2, \begin{cases} p_{2i-1}^{(in)} = \mathcal{F}_1(p'_{2i-1}, p'_{2i}) \\ p_{2i}^{(in)} = \mathcal{F}_2(p'_{2i-1}, p'_{2i}) \end{cases}$$

so as to obtain the probability functions relative to the inputs of the considered parallel kernels. Then the step S298 is performed.

In the step S298, the polarizer POL-N 220 returns the output values $g_{1:n}^{(in)}$ to the call started to be executed in the step S291, which ends the algorithm of FIG. 2D for the considered recursion.

Finally, for the polarizer POL-N 220, the set of probability functions $p_{1:N}^{(in)}$ is computed from the set of probability functions $p_{1:N}^{(out)}$. The definition of the positions of the frozen bits in the vector b may then be obtained on the basis of mutual information or bit error rate computed or obtained from the probability functions $p_{1:n}^{(in)}$. The set of probability functions $p_{1:N}^{(in)}$ allows to directly compute the set of mutual information $\{I(x_i^{(in)}; y|x_{i:n-1}^{(in)})\}_i$. The indexes associated to the $N \cdot (1-R)$ lowest values are then assigned to the frozen bits, i.e. the value "1" is correspondingly set in the vector F. Alternatively, the definition of the positions of the frozen bits in the vector b may then be obtained on the basis of error probability. The set of probability functions $p_{1:N}^{(in)}$ allows to compute bit error probabilities of a decision on each input bit $x_i^{(in)}$. The indexes associated to the $N \cdot (1-R)$ highest values are then assigned to the frozen bits, i.e. the value "1" is correspondingly set in the vector F.

Thus as shown in the modular architecture schematically represented in FIG. 4A, so as to be able to retrieve an estimation b* of the vector b from observations y made by the decoder 120, said decoder 120 comprises an LLR computing module 421, a beliefs propagation decoder 422 and a decision maker 423, which together form the decoding part 420 of the decoder 120. The decoder 120 further includes a demultiplexer 410 that converts the estimation b* of the vector b into an estimation b'* of the vector b', from a knowledge of the positions of the frozen bits used by the encoder 110. The LLR computing module 421 outputs the observations in LLR form, namely a vector $L_x$, which are then used by the beliefs propagation decoder 422 in conjunction with $L_b$ being the vector of a priori probabilities at the input of the polar code and which is initialized thanks to the prior knowledge of the frozen bits values and positions, also in LLR form, so as to output estimates $\hat{L}_b$ also in LLR form. The estimates $\hat{L}_b$ are thus refined estimates of the bits of the vector b in view of the inputs $L_b$ and $L_x$ of the decoder 120, and are then used by the decision maker 423 so as to determine the estimation b* of the vector b. The beliefs propagation decoder 422 may further output estimates $\hat{L}_x$ that are refined estimates of the observations $L_x$ in view of the inputs $L_b$ and $L_x$ of the decoder, in order to iterate with other probabilistic detection blocks of the decoder 120, such as for refinement of channel estimation and/or refinement of QAM (Quadrature Amplitude Modulation) symbols demodulation in a MIMO (Multiple-Input Multiple-Output) transmission context.

The behaviour of the decoder 120 is schematically shown by the algorithm in FIG. 4B.

In a step S451, the decoder 120 initializes a vector $L_b$ first as a null vector, and then the decoder 120 modifies the vector $L_b$ according to the knowledge of the positions of the frozen bits used by the encoder 110, as follows:

$$\forall 0 < j \leq N, F(j) = 1 \Rightarrow L_b(j) = +\infty$$

where $+\infty$ indicates that the LLR $L_b$ (j) of the j-th bits gives '0' as a value for this bit with probability 1. It has to be noted that the frozen bits are initialized with a '1' value instead of '0', the value of the LLR should be $-\infty$.

wherein $+\infty$ is numerically represented by a value that is sufficiently high to be out of the scope of the LLR values that can exist at the input of any polarizer of size n, with n being a power of "2" such that $0 < n \leq N/2$. It means that, for any index value that corresponds to a position of a frozen bit in the vector b, the value of the vector $L_b$ at said index value is set to infinity or a default value representative thereof, and set to "0" otherwise.

In a following step S452, the decoder 120 initializes internal variables $L'_{1:N}{}^{(in)}$ and $L'_{1:N}{}^{(out)}$ with null values. Said internal variables are intended to be propagated along the recursions of the beliefs propagation.

In a following step S453, the decoder 120 computes beliefs propagation using the internal variables $L'_{1:N}{}^{(in)}$ and $L'_{1:N}{}^{(out)}$ according to the known D&C of the polarizer POL-N 220 and to the observations $L_x$ in LLR form. In other words, the decoder 120 uses the algorithm schematically shown in FIG. 4D by inputting therein the vector $L_b$ as $L_{1:N}{}^{(in)}$ and the vector $L_x$ as $L_{1:N}{}^{(out)}$. The output of the beliefs propagation are the vectors $\hat{L}_b$ and $\hat{L}_x$, wherein the vector $\hat{L}_b$ is then used by the decision maker 423 to determine the estimation b* of the vector b.

In a following step S454, the decoder 120 makes a decision on each bit of the estimation b* of the vector b according to the estimates $\hat{L}_b$ output by the beliefs propagation decoder 422. The decision is made as follows:

$$\forall 0 < j \leq N, \begin{cases} \hat{L}_b(j) > 0 \Rightarrow \hat{b}(j) = 0 \\ \hat{L}_b(j) < 0 \Rightarrow \hat{b}(j) = 1 \end{cases}$$

$\hat{L}_b(j)$, $\forall 0 < j \leq N$, should not be equal to "0". In case such a situation occurs, the decoder 120 arbitrarily sets the corresponding bit $\hat{b}(j)$ either to "0" or to "1".

Then, since the decoder 120 knows the positions of the frozen bits in the vector b, the decoder is able to extract therefrom the information bits so as to form the estimation b'* of the vector b', which ends the transfer of said information bits from the encoder 110 to the decoder 120 using the polar code approach.

The behaviour of the belief propagation decoder 422, as apparent in the step S453, is schematically shown by the algorithm in FIG. 4D, by applying the factor graph schematically shown in FIG. 4C.

Belief propagation propagates probabilities (beliefs) from left to right and right to left within each kernel of the polarizer POL-N 220. Referring to the kernel schematically represented in FIG. 4C, let us consider a kernel with input beliefs (in the form of LLR) $L_{1:2}{}^{(in)}$ from the left side of the kernel and $L_{1:2}{}^{(out)}$ from the right side of the kernel, and with output beliefs (in the form of LLR) $\hat{L}_{1:2}{}^{(in)}$ from the left side of the kernel and $\hat{L}_{1:2}{}^{(out)}$ from the right side of the kernel. Update functions $\mathcal{B}_1{}^{(in)}$, $\mathcal{B}_2{}^{(in)}$, $\mathcal{B}_1{}^{(out)}$ and $\mathcal{B}_2{}^{(out)}$ linking the input beliefs to the output beliefs, are hence defined as follows:

$$\hat{L}_1{}^{(in)} = \mathcal{B}_1{}^{(in)}(L_{1:2}{}^{(in)}, L_{1:2}{}^{(out)}) = 2 \cdot a \tan h(\tan h \\ ((L_2{}^{(in)} + L_2{}^{(out)})/2) \cdot \tan h(L_1{}^{(out)}/2))$$

$$\hat{L}_2{}^{(in)} = \mathcal{B}_2{}^{(in)}(L_{1:2}{}^{(in)}, L_{1:2}{}^{(out)}) = 2 \cdot a \tan h(\tan h(L_1{}^{(in)}/2) \cdot \tan h(L_1{}^{(out)}/2)) + L_2{}^{(out)}$$

$$\hat{L}_1{}^{(out)} = \mathcal{B}_1{}^{(out)}(L_{1:2}{}^{(in)}, L_{1:2}{}^{(out)}) = 2 \cdot a \tan h(\tan h \\ ((L_2{}^{(in)} + L_2{}^{(out)})/2) \cdot \tan h(L_1{}^{(in)}/2))$$

$$\hat{L}_2{}^{(out)} = \mathcal{B}_2{}^{(out)}(L_{1:2}{}^{(in)}, L_{1:2}{}^{(out)}) = 2 \cdot a \tan h(\tan h \\ (L_1{}^{(in)}/2) \cdot \tan h(L_1{}^{(out)}/2)) + L_2{}^{(in)}$$

In a step S471, the belief propagation decoder 422 executes a call for performing a recursive computation for the input beliefs $L_{1:n}{}^{(in)}$ and $L_{1:n}{}^{(out)}$, with n being a power of "2" such that $2 \leq n \leq N$, so as to get the output beliefs $\hat{L}_{1:n}{}^{(in)}$ and $\hat{L}_{1:n}{}^{(out)}$. At the very first recursion the call relates to a recursive computation for the input beliefs $L_{1:N}{}^{(in)}$ and $L_{1:N}{}^{(out)}$, so as to get the output beliefs $\hat{L}_{1:N}{}^{(in)}$ and $\hat{L}_{1:N}{}^{(out)}$.

In a step S472, the belief propagation decoder 422 checks whether n is equal to "2". If n is equal to "2", a step S473 is performed; otherwise, a step S474 is performed.

In the step S473, the belief propagation decoder 422 performs the following operations, so as to get the concerned output beliefs $\hat{L}_1{}^{(in)}$, $\hat{L}_2{}^{(in)}$, $\hat{L}_1{}^{(out)}$ and $\hat{L}_2{}^{(out)}$:

$$\hat{L}_1{}^{(in)} = \mathcal{B}_1{}^{(in)}(L_{1:2}{}^{(in)}, L_{1:2}{}^{(out)})$$

$$\hat{L}_2{}^{(in)} = \mathcal{B}_2{}^{(in)}(L_{1:2}{}^{(in)}, L_{1:2}{}^{(out)})$$

$$\hat{L}_1{}^{(out)} = \mathcal{B}_1{}^{(out)}(L_{1:2}{}^{(in)}, L_{1:2}{}^{(out)})$$

$$\hat{L}_2{}^{(out)} = \mathcal{B}_2{}^{(out)}(L_{1:2}{}^{(in)}, L_{1:2}{}^{(out)})$$

Then a step S479 is performed.

In the step S474, the belief propagation decoder 422 calls the recursive computation for the beliefs $L_{2i-1:2i}{}^{(in)}$ and $L'_{2i-1:2i}{}^{(out)}$, $\forall 0 < i \leq n/2$, so as to get beliefs $\hat{L}_{2i-1:2i}{}^{(in)}$ and $\hat{L}'_{2i-1:2i}{}^{(out)}$. It means that the algorithm of FIG. 4D is then recursively executed with a polarization size of "2" onto each couple of data $\hat{L}_{2i-1:2i}{}^{(in)}$ and $\hat{L}'_{2i-1:2i}{}^{(out)}$, $\forall 0 < i \leq n/2$.

In a following step S475, the belief propagation decoder 422 calls the recursive computation for the beliefs $L'_{1:n/2}{}^{(in)}$ and $L_{1:n/2}{}^{(out)}$, so as to get beliefs $\hat{L}'_{1:n/2}{}^{(in)}$ and $\hat{L}_{1:n/2}{}^{(out)}$. It means that the algorithm of FIG. 4D is then recursively executed with a polarization size of n/2 onto the data $L'_{1:n/2}{}^{(in)}$ and $L_{1:n/2}{}^{(out)}$.

In a following step S476, the belief propagation decoder 422 calls the recursive computation for the beliefs $L'_{n/2+1:n}{}^{(in)}$ and $L_{n/2+1:n}{}^{(out)}$ so as to get beliefs $\hat{L}_{n/2+1:n}{}^{(in)}$ and $\hat{L}_{n/2+1:n}{}^{(out)}$. It means that the algorithm of FIG. 4D is then recursively executed with a polarization size of n/2 onto the data $L'_{n/2+1:n}{}^{(in)}$ and $L_{n/2+1:n}{}^{(out)}$.

It has to be noted that the steps S474, S475 and S476 may be inverted or executed in parallel.

In a following step S477, the belief propagation decoder 422 applies the inverse of the shuffling operation InvShuff onto the data $\hat{L}'_{1:n}{}^{(in)}$ so as to get the data $L'_{1:n}{}^{(out)}$. The data $L'_{1:n}{}^{(out)}$ are thus updated when exiting the call process later on in a step S479.

In a following step S478, the belief propagation decoder 422 applies the shuffling operation Shuff onto the data $\hat{L}'_{1:n}{}^{(out)}$ so as to get the data $\hat{L}'_{1:n}{}^{(in)}$. The data $L'_{1:n}{}^{(in)}$ are thus updated when exiting the call process later on in the step S479.

It has to be noted that the steps S477 and S478 may be inverted or executed in parallel.

In the following step S479, the belief propagation decoder 422 returns the output beliefs $\hat{L}_{1:n}{}^{(in)}$ and $\hat{L}_{1:n}{}^{(out)}$ to the call started to be executed in the step S471, which ends the algorithm of FIG. 4D for the considered recursion.

The main strength of the polar code approach is its asymptotical optimality. The asymptotical conditions result in perfect channels (mutual information equal to "1", or error rate equal to "0") for transferring information bits and in null channels (mutual information equal to "0", or error rate equal to "1") for transferring frozen bits. It can be seen from the above introductive description that, at finite length, channel polarization has not fully converged to perfect and null equivalent channels, leading to a non-perfect equivalent global channel with non-null error rate and non-unitary mutual information for the information bits. Furthermore, the frozen bits are thus transferred on channels with a non-null mutual information, which involves a loss in information rate since capacity is conserved by the polarizer POL-N 220.

SUMMARY OF INVENTION

It is desirable to improve, preferably minimize, probability of error and/or to improve, preferably maximize, information rate for finite length polar codes.

It is further desirable to provide a solution that allows keeping low complexity benefit of the polar codes. It is further desirable to provide a solution that is simple and cost-effective.

To that end, the present invention concerns a method for configuring a Divide and Conquer structure of a polar-code based encoder performing a transfer of useful data to a polar-code based decoder via a Binary Discrete-input Memory-less Channel, the method being performed by the polar-code based encoder, the Divide and Conquer structure consisting of a multiplexer followed by a polarization block of size $N=2^L$, the multiplexer having useful data bits and a set of frozen bits as inputs so as to form input data $x_{1:N}{}^{(in)}$, wherein the polarization block of size N comprises a set of front kernels followed by a shuffler and two complementary polarization sub-blocks of size N/2 with a similar structure as the polarization block of size N but with half its size, wherein the shuffler distributes its odd entries to one of the complementary polarization sub-blocks and its even entries to the other one of the complementary polarization sub-blocks, such that the Divide and Conquer structure is recursive with a depth equal to L. A dynamically configurable interleaver is present between the shuffler and one and/or the other of the complementary polarization sub-blocks at each recursion of the Divide and Conquer structure, and the method comprises: detecting change in the Binary Discrete-input Memory-less Channel; obtaining probability functions $p_{1:n}{}^{(out)}$, which characterize channel transitions probabilities of the Binary Discrete-input Memory-less Channel at output of the polarization block of size N, according to the detected change in the Binary Discrete-input Memory-less Channel; computing probability functions $p_{1:N}{}^{(in)}$, which characterize channel transitions probabilities of an equivalent Binary Discrete-input Memory-less Channel at input of the polarization block of size N, from the obtained probability functions $p_{1:N}{}^{(out)}$ for a set of interleaving configurations of the dynamically configurable interleavers, determining, corresponding positions of the frozen bits and determining a corresponding figure of merit value, wherein the figure of merit is an estimation representative of performance of the transfer to the polar-code based decoder via the Binary Discrete-input Memory-less Channel; and selecting and applying the interleaving configuration of the dynamically configurable interleavers which shows the best performance of the transfer to the polar-code based decoder via the Binary Discrete-input Memory-less Channel in view of the determined corresponding figure of merit values.

Thus, improvement of performance for finite length polar codes used over a BDMC is achieved. Moreover, low complexity benefit of the polar codes is kept.

According to a particular embodiment, the figure of merit is mutual information-based and is defined as follows:

$$\sum_{0<j\leq N|F(j)=0} I(x_j^{(in)}; y \mid x_{1:j-1}^{(in)})$$

wherein $I(x_j^{(in)}; y|x_{1:j-1}^{(in)})$ is the mutual information between the j-th input $x_j^{(in)}$ of the polarization block of size N and an observation vector y, assuming that the values of the inputs $x_{1:j-1}^{(in)}$ are known or correctly decoded, and wherein F is an N-long vector indicating the positions of the frozen bits at corresponding entries set to '1'.

Thus, polar code improvement can be cost-effectively achieved by relying on such mutual information.

According to a particular embodiment, the figure of merit is information word decoding success-related and is defined as follows:

$$\prod_{0<j\leq N|F(j)=0} (1 - P_e(x_j^{(in)} \mid x_{1:j-1}^{(in)}; y))$$

wherein $P_e(x_j^{(in)}|x_{1:j-1}^{(in)}; y)$ represents decoding success probability of the j-th input $x_j^{(in)}$ of the polarization block of size N and thus $1-P_e(x_j^{(in)}|x_{1:j-1}^{(in)}; y)$ represents the bit error probability for said j-th input $x_j^{(in)}$ of the polarization block of size N, and wherein F is an N-long vector indicating the positions of the frozen bits at corresponding entries set to '1'.

Thus, polar code improvement can be cost-effectively achieved by relying on such bit error probability.

According to a particular embodiment, the set of interleaving configurations of the dynamically configurable interleavers is defined using a genetic approach, by considering all possible interleaving configuration input-output association switches.

Thus, interleaving configuration tests are cost-effectively performed so as to reach an optimized interleaving configuration adapted to the changes that occurred on the BDMC.

According to a particular embodiment, the set of interleaving configurations of the dynamically configurable interleavers gathers all interleaving configurations made possible by the dynamically configurable interleavers.

Thus, interleaving configuration tests are exhaustively performed.

According to a particular embodiment, the set of interleaving configurations of the dynamically configurable interleavers consists of a predefined codebook of interleaving configurations.

Thus, interleaving configuration tests are cost-effectively performed.

According to a particular embodiment, the set of interleaving configurations of the dynamically configurable interleavers consists of a predefined quantity of random configurations of the dynamically configurable interleavers.

Thus, interleaving configuration tests are cost-effectively performed.

According to a particular embodiment, the Binary Discrete-input Memory-less Channel is a Binary Erasure Channel modelled by relying on erasure rate as parameter monitored to obtain the probability functions $p_{1:N}^{(out)}$.

Thus, transmission over Binary Erasure Channels is improved.

According to a particular embodiment, the Binary Discrete-input Memory-less Channel is an Additive White Gaussian Noise channel over which a Binary Phase Shift Keying modulation is used and modelled by relying on Signal-to-Noise Ratio as parameter monitored to obtain the probability functions $p_{1:N}^{(out)}$.

Thus, transmission over an Additive White Gaussian Noise channel over which a Binary Phase Shift Keying modulation is used is improved.

The present invention further concerns a method for performing a transfer of useful data from a polar-code based encoder to a polar-code based decoder via a Binary Discrete-input Memory-less Channel, the polar-code based encoder including a Divide and Conquer structure consisting of a multiplexer having useful data bits and a set of frozen bits as inputs followed by a polarization block of size $N=2^L$, wherein the polar-code based encoder performs the method as defined above and the polar-code based decoder performs: detecting change in the Binary Discrete-input Memory-less Channel; obtaining a interleaving configuration dynamically defined by the polar-code based encoder according to the detected change in the Binary Discrete-input Memory-less Channel; configuring a beliefs propagation decoder according to the obtained interleaving configuration. The method is further such that the beliefs propagation decoder thus configured is implemented in the polar-code based decoder, so as to decode observations made by said polar-code based decoder via the Binary Discrete-input Memory-less Channel during the transfer of useful data from a polar-code based encoder.

According to a particular embodiment, the polar-code based decoder obtains the interleaving configuration by simulating, in view of the probability functions $p_{1:n}^{(out)}$, the behaviour of the polar-code based encoder 110 when dynamically determining the interleaving configuration to be applied.

Thus, polar code structure information transfer from the polar-code based encoder to the polar-code based decoder can be avoided.

The present invention further concerns a polar-code based encoder intended to perform a transfer of useful data to a polar-code based decoder via a Binary Discrete-input Memory-less Channel, the polar-code based encoder including a Divide and Conquer structure consisting of a multiplexer having useful data bits and a set of frozen bits as inputs followed by a polarization block of size $N=2^L$, wherein the polarization block of size N comprises a set of front kernels followed by a shuffler and two complementary polarization sub-blocks of size N/2 with a similar structure as the polarization block of size N but with half its size, wherein the shuffler distributes its odd entries to one of the complementary polarization sub-blocks and its even entries to the other one of the complementary polarization sub-blocks, such that the Divide and Conquer structure is recursive with a depth equal to L. The polar-code based encoder is further such that a dynamically configurable interleaver is present between the shuffler and one and/or the other of the complementary polarization sub-blocks at each recursion of the Divide and Conquer structure, and the polar-code based encoder further comprises: means for detecting change in the Binary Discrete-input Memory-less Channel; means for obtaining probability functions $p_{1:N}^{(out)}$, which characterize channel transitions probabilities of the Binary Discrete-input Memory-less Channel at output of the polarization block of size N, according to the detected change in the Binary Discrete-input Memory-less Channel; means for computing probability functions $p_{1:N}^{(in)}$, which characterize channel transitions probabilities of an equivalent Binary Discrete-input Memory-less Channel at input of the polarization block of size N, from the obtained probability functions a set of interleaving configurations of the dynamically configurable interleavers, determining corresponding positions of the frozen bits and determining a corresponding figure of merit value, wherein the figure of merit is an estimation representative of performance of the transfer to the polar-code based decoder via the Binary Discrete-input Memory-less Channel; and means for selecting and applying the interleaving configuration of the dynamically configurable interleavers which shows the best performance of the transfer to the polar-code based decoder via the Binary Discrete-input Memory-less Channel in view of the determined corresponding figure of merit values.

The present invention further concerns a system including a polar-code based encoder and a polar-code based decoder, the polar-code based encoder being intended to perform a transfer of useful data to the polar-code based decoder via a Binary Discrete-input Memory-less Channel, the polar-code based encoder including a Divide and Conquer structure consisting of a multiplexer having useful data bits and a set of frozen bits as inputs followed by a polarization block of size $N=2^L$, wherein the polar-code based encoder as defined above, and the polar-code based decoder comprises: means for detecting change in the Binary Discrete-input Memory-less Channel; means for obtaining a interleaving configuration dynamically defined by the polar-code based encoder according to the detected change in the Binary Discrete-input Memory-less Channel; means for configuring a beliefs propagation decoder according to the obtained interleaving configuration. The system is further such that the beliefs propagation decoder thus configured is implemented in the polar-code based decoder, so as to decode observations made by said polar-code based decoder via the Binary Discrete-input Memory-less Channel during the transfer of useful data from a polar-code based encoder.

The present invention also concerns, in at least one embodiment, a computer program that can be downloaded from a communication network and/or stored on a non-transitory information storage medium that can be read by a computer and run by a processor or processing electronics circuitry. This computer program comprises instructions for implementing the aforementioned method in any one of its various embodiments, when said program is run by the processor or processing electronics circuitry.

The present invention also concerns a non-transitory information storage medium, storing a computer program comprising a set of instructions that can be run by a processor for implementing the aforementioned method in any one of its various embodiments, when the stored information is read from the non-transitory information storage medium by a computer and run by a processor or processing electronics circuitry.

The characteristics of the invention will emerge more clearly from a reading of the following description of an example of embodiment, said description being produced with reference to the accompanying drawings.

DESCRIPTION OF EMBODIMENTS

The following description applies to a wireless communication between a transmitter including a polar code-based encoder and a receiver including a corresponding polar-code based decoder. The principles detailed hereafter may also be applied to communications of other kind, such as optical communications or wired communications. Moreover, the principles detailed herein may also be applied to a context of encoding original data, of storing encoded data in memory and then of reading the stored data later on for further decoding and retrieval of the original data.

Figure 1:
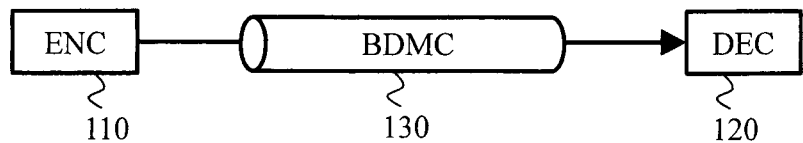
FIG. 1 schematically represents a system including a polar code encoder and a corresponding polar code decoder.

The system described herein relies on the same context as shown in FIG. 1. However, the encoder 110 and the decoder 120 are arranged as detailed hereafter.

Figure 5A:
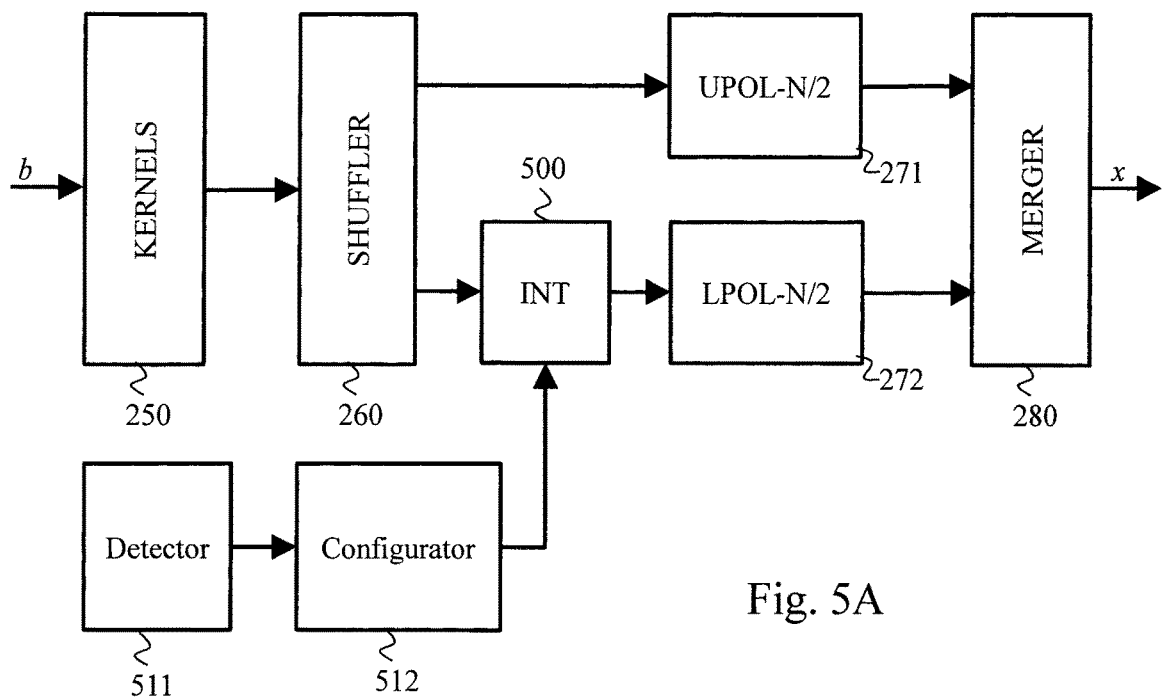
FIG. 5A schematically represents a first embodiment of a modular architecture of the encoding part according to the present invention.

FIG. 5A schematically represents a first embodiment of a modular architecture of the polarizer POL-N 220 according to the present invention.

Figure 2A:
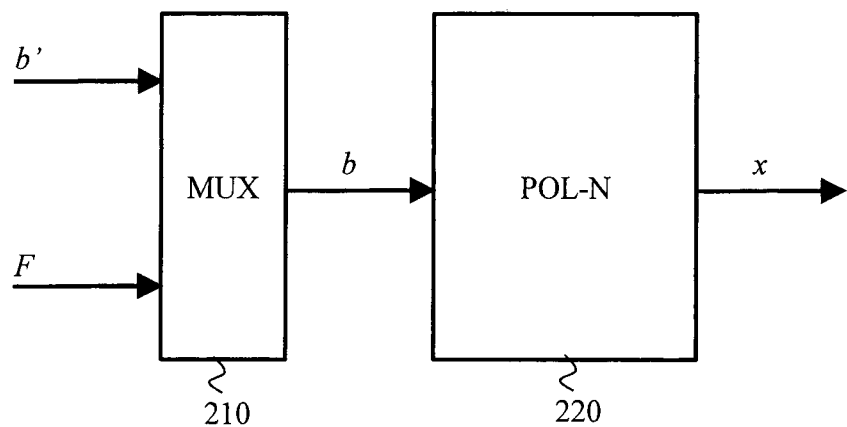
FIG. 2A schematically represents an encoding part of the encoder according to the prior art.
Figure 2B:
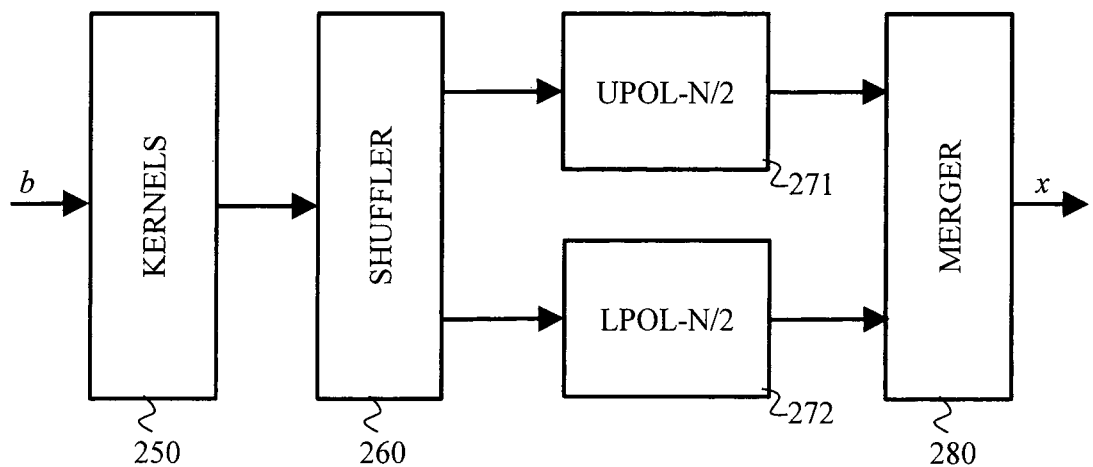
FIG. 2B schematically represents a modular architecture of the encoding part according to the prior art.
Figure 2C:
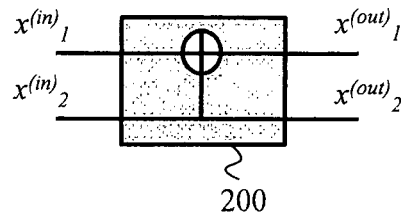
FIG. 2C schematically represents a kernel structure as used in the encoding part according to the prior art.

As in FIG. 2B, the polarizer POL-N 220 comprises the front kernels 250, the shuffler 260, the upper polarizer UPOL-N/2 271 of size N/2 and the lower polarizer LPOL-N/2 272 of size N/2 and the merger 280. Contrary to the arrangement in FIG. 2B, the first embodiment shown in FIG. 5A further includes an interleaver 500 inserted between the shuffler 260 and the lower polarizer LPOL-N/2 272 of size N/2. The upper polarizer UPOL-N/2 271 and the lower polarizer LPOL-N/2 272 have the same structure and are built like the polarizer POL-N 220 but with half its size. It means that each polarizer of size N/2 is built from two other polarizers of size N/4, and so on, as far as reaching a couple of polarizers of size equal to "2" as shown in FIG. 2C. Therefore, in the first embodiment, such an interleaver 500 is placed between each shuffler and each lower polarizer. Each interleaver 500 can be dynamically configured, so as to be able to dynamically define which output among the n/2, with n being a power of "2" such that $2 < n \leq N/2$, concerned outputs of the shuffler in question is connected to which input of the lower polarizer in question. As detailed hereafter, each interleaver 500 can be configured independently from any other interleaver 500 of the polarizer POL-N 220.

The polarizer POL-N 220 further comprises a configurator 512 to which each interleaver 500 is connected. The configurator 512 is in charge of configuring each interleaver 500. Thus the configurator 512 dynamically defines which output among the n/2, with n being a power of "2" such that $2 < n \leq N/2$, concerned outputs of the shuffler in question is connected to which input of the lower polarizer in question. This aspect is detailed hereafter with regard to FIGS. 7 and 8.

The polarizer POL-N 220 further comprises a detector 511 that is connected to the configurator 512 so as to activate the configurator 512 for defining a new configuration to be applied by the interleavers 500 of the polarizer POL-N 220. This aspect is detailed hereafter with regard to FIG. 7.

Figure 5B:
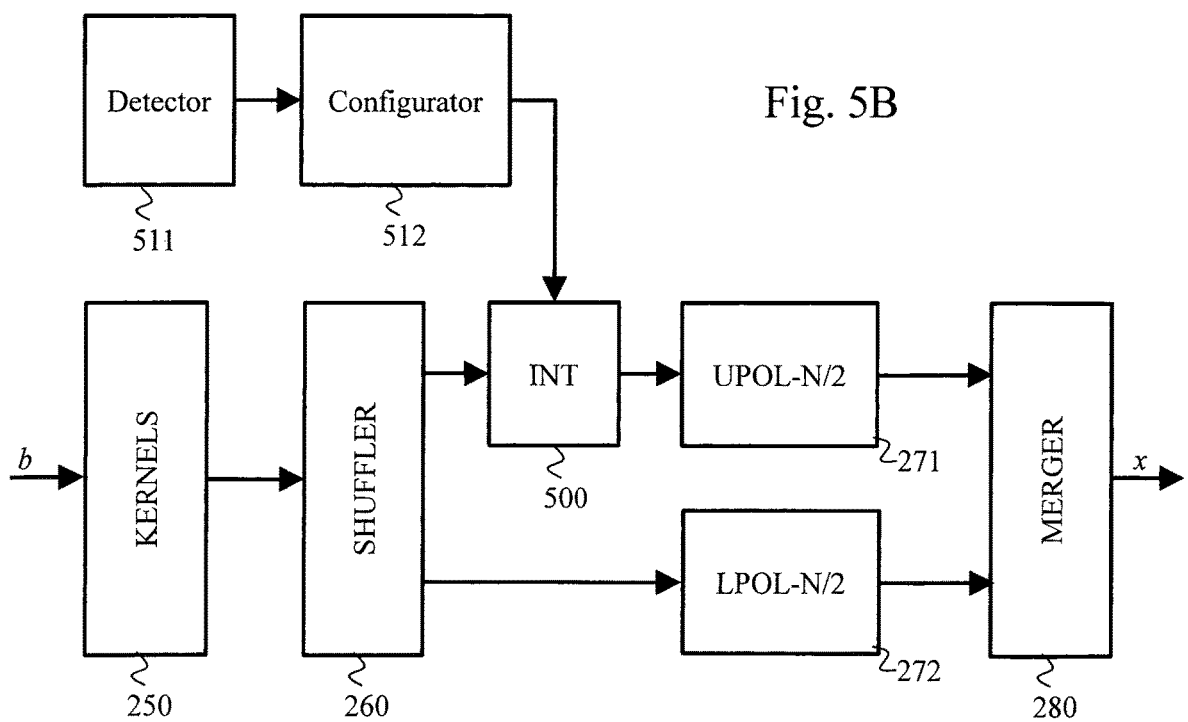
FIG. 5B schematically represents a second embodiment of a modular architecture of the encoding part according to the present invention.

FIG. 5B schematically represents a second embodiment of the modular architecture of the polarizer POL-N 220 according to the present invention.

As in FIG. 2B, the polarizer POL-N 220 comprises the front kernels 250, the shuffler 260, the upper polarizer UPOL-N/2 271 of size N/2 and the lower polarizer LPOL-N/2 272 of size N/2 and the merger 280. Contrary to the arrangement in FIG. 2B, the second embodiment shown in FIG. 5B further includes the interleaver 500. In FIG. 5B, the interleaver 500 is inserted between the shuffler 260 and the upper polarizer UPOL-N/2 271 of size N/2. The upper polarizer UPOL-N/2 271 and the lower polarizer LPOL-N/2 272 have the same structure and are built like the polarizer POL-N 220 but with half its size. It means that each polarizer of size N/2 is built from two other polarizers of size N/4, and so on, as far as reaching a couple of polarizers of size equal to "2" as shown in FIG. 2C. Therefore, in the second embodiment, such an interleaver is placed between each shuffler and each upper polarizer. Each interleaver can be dynamically configured, so as to be able to dynamically define which output among the n/2, with n being a power of "2" such that 2<n≤N/2, concerned outputs of the shuffler in question is connected to which input of the upper polarizer in question. As detailed hereafter, each interleaver can be configured independently from any other interleaver of the polarizer POL-N 220.

The polarizer POL-N 220 further comprises the configurator 512 to which each interleaver 500 is connected. The configurator 512 is in charge of configuring each interleaver 500. Thus the configurator 512 dynamically defines which output among the n/2, with n being a power of "2" such that 2<n≤N/2, concerned outputs of the shuffler in question is connected to which input of the upper polarizer in question. This aspect is detailed hereafter with regard to FIGS. 7 and 8.

The polarizer POL-N 220 further comprises the detector 511 that is connected to the configurator 512 so as to activate the configurator 512 for defining a new configuration to be applied by the interleavers 500 of the polarizer POL-N 220. This aspect is detailed hereafter with regard to FIG. 7.

Figure 5C:
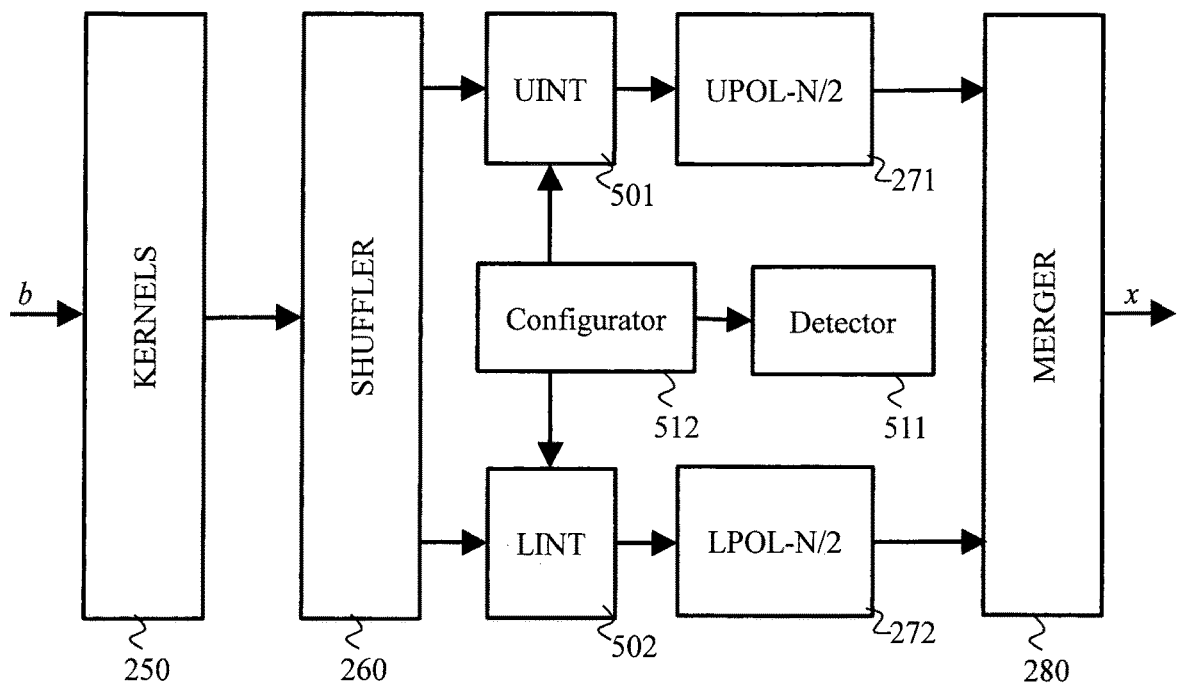
FIG. 5C schematically represents a third embodiment of a modular architecture of the encoding part according to the present invention.

FIG. 5C schematically represents a third embodiment of the modular architecture of the polarizer POL-N 220 according to the present invention.

As in FIG. 2B, the polarizer POL-N 220 comprises the front kernels 250, the shuffler 260, the upper polarizer UPOL-N/2 271 of size N/2 and the lower polarizer LPOL-N/2 272 of size N/2 and the merger 280. Contrary to the arrangement in FIG. 2B, the third embodiment shown in FIG. 5C further includes two interleavers 501 and 502. In FIG. 5C, the interleaver 501 is inserted between the shuffler 260 and the upper polarizer UPOL-N/2 271 of size N/2 and the interleaver 502 is inserted between the shuffler 260 and the lower polarizer LPOL-N/2 272 of size N/2. The upper polarizer UPOL-N/2 271 and the lower polarizer LPOL-N/2 272 have the same structure and are built like the polarizer POL-N 220 but with half its size. It means that each polarizer of size N/2 is built from two other polarizers of size N/4, and so on, as far as reaching a couple of polarizers of size equal to "2" as shown in FIG. 2C. Therefore, in the third embodiment, such one interleaver 501 is placed between each shuffler and each upper polarizer and another one such interleaver 502 is placed between each shuffler and each lower polarizer. Each interleaver 501 and 502 can be dynamically configured, so as to be able to dynamically define which output among the n/2, with n being a power of "2" such that 2<n≤N/2, concerned outputs of the shuffler in question is connected to which input of the upper polarizer in question, and to be able to dynamically define which output among the n'/2, with n' being a power of "2" such that 2<n'≤N/2, concerned outputs of the shuffler in question is connected to which input of the lower polarizer in question. As detailed hereafter, each interleaver 501 and 502 can be configured independently from any other interleaver 501 and 502 of the polarizer POL-N 220.

It has to be noticed that the introduction of the interleavers 501 and 502 in the internal structure of the polarizer POL-N 220 maintains independency between random variables input to the upper polarizer UPOL-N/2 271 and random variables input to the lower polarizer LPOL-N/2 272.

The polarizer POL-N 220 further comprises the configurator 512 to which each interleaver 501 and 502 is connected. The configurator 512 is in charge of configuring each interleaver 501 and 502. Thus the configurator 512 dynamically defines which output among the n/2, with n being a power of "2" such that 2<n≤N/2, concerned outputs of the shuffler in question is connected to which input of the lower polarizer in question, and the configurator 512 dynamically defines which output among the n'/2, with n' being a power of "2" such that 2<n'≤N/2, concerned outputs of the shuffler in question is connected to which input of the upper polarizer in question. This aspect is detailed hereafter with regard to FIGS. 7 and 8.

The polarizer POL-N 220 further comprises the detector 511 that is connected to the configurator 512 so as to activate the configurator 512 for defining a new configuration to be applied by the interleavers 501 and 502 of the polarizer POL-N 220. This aspect is detailed hereafter with regard to FIG. 7.

As already mentioned, the size of the polarizer POL-N 220 is $N=2^L$ and comprises two sub-polarization blocks having respectively a size equal to N/2, and each one of said sub-polarization blocks comprises two sub-polarization blocks having respectively a size equal N/4, and so on. Finally, the polarizer POL-N 220 comprises L−1 sub-polarization stages, which means $2(2^{L-1}-1)$ sub-polarization blocks within which $2^i$ sub-polarization blocks have a size equal to $2^{L-i}$.

Let illustratively consider that $\varphi_u$ represents the configuration of the interleaver identified by an index u such that $0<u<2^{L-1}$ and further considering that there is one interleaver for each lower sub-polarization block. Indeed, it can be demonstrated that it is equivalent in terms of polar code result to insert an interleaver for each sub-polarization block of each sub-polarization stage as to insert only one interleaver per sub-polarization stage, but it only leads to a higher complexity in terms of polar code design. Each interleaver may be configured so as to be transparent, which is equivalent as deactivating said interleaver. The index u is such that it is representative of the position of the considered interleaver within the polarizer POL-N 220. Thus, the polarizer POL-N 220 comprises L−1 sub-polarization stages, which means $2(2^{L-1}-1)$ sub-polarization blocks and $(2^{L-1}-1)$ interleavers. Furthermore, the index u, which is an integer that can be decomposed into a binary word representation $u_b(1)$, . . . , $u_b(L-1)$, represents the path through the D&C structure to reach the interleaver in question. The path representation, obtained thanks to the index u, indicates for each bit of the index u whether the upper branch (where is located the upper sub-polarization block) or the lower branch (where is located the upper sub-polarization block) is selected, as follows:

$u_b(i)=1$ indicates that the interleaver in question is located on the lower branch of the i-th recursion of the D&C structure; and $u_b(i)=0$ indicates that the interleaver in question is located on the upper branch of the i-th recursion of the D&C structure.

When the interleaver identified by the index u is present at the i-th sub-polarization stage (mandatorily between the shuffler of said i-th sub-polarization stage and the lower sub-polarization block), it means that the input $u_b(i)=1$ and then the inputs $u_b(j>i)=0$.

In other words, for a given interleaving configuration $\varphi_u$, one can get the binary representation $u_b(1), \ldots, u_b(L-1)$ of the index u, and thus, by finding the last non-null input i such that $u_b(j>i)=0$, it can be determined that the interleaver to which it is referred is placed in the i-th recursion depth in the recursive construction of the polarizer POL-N 220. This value is given by $i=\lfloor \log_2(u) \rfloor +1$. Thus, since the size of the polarizer POL-N 220 at the i-th recursion depth is $2^{L-i+1}$, and since the interleaver is of half this size, the size of $\varphi_u$ is $2^{L-i}$. Thus, the size of $\varphi_u$ is equal to $2^{L-\lfloor log_2(u) \rfloor}$.

Figure 6:
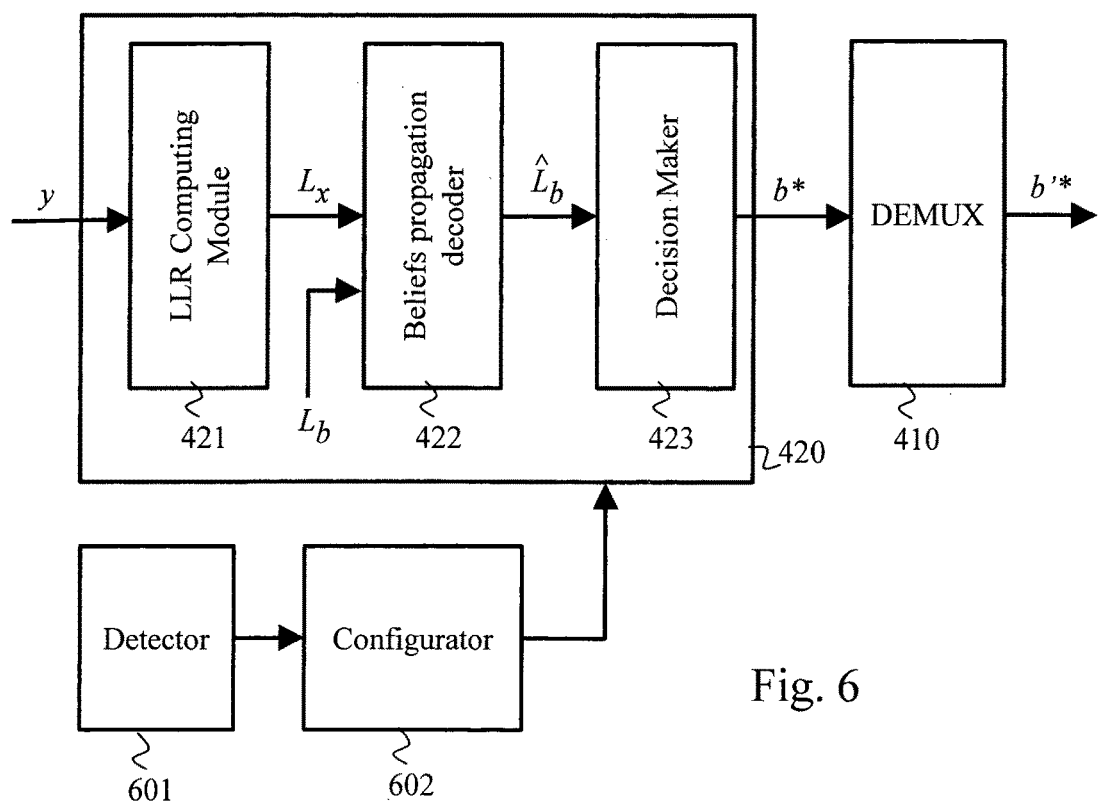
FIG. 6 schematically represents a modular architecture of the decoding part according to the present invention.

FIG. 6 schematically represents a modular architecture of the decoding part according to the present invention.

Figure 4A:
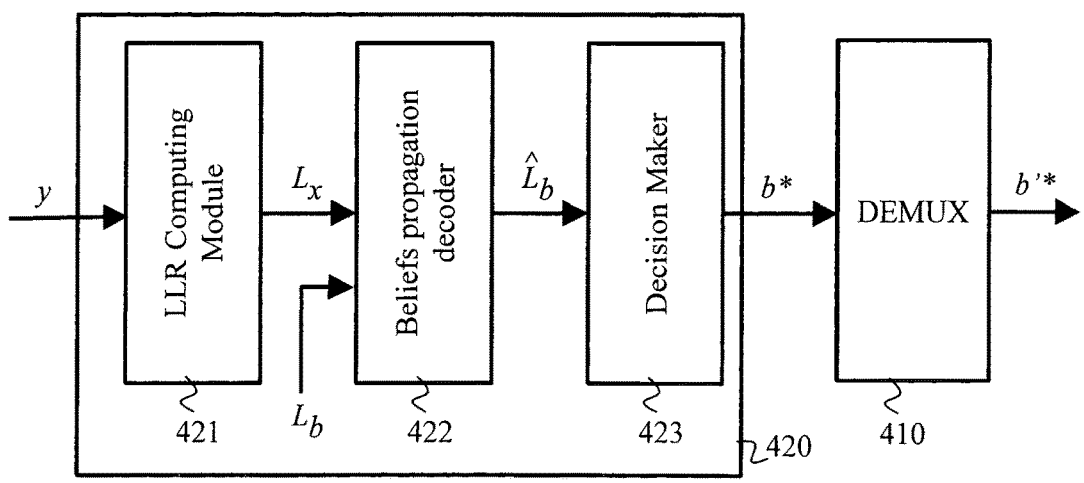
FIG. 4A schematically represents a modular architecture of the decoding part according to the prior art.
Figure 4B:
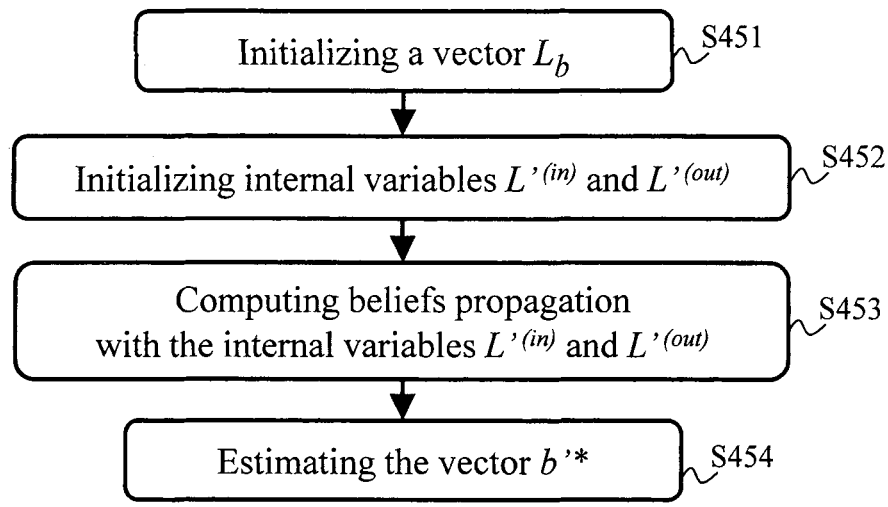
FIG. 4B schematically represents a decoding algorithm according to the prior art.
Figure 4C:
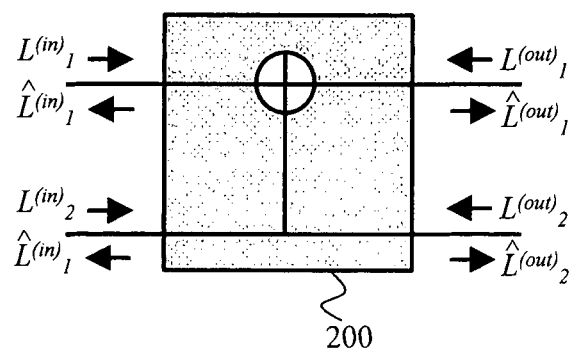
FIG. 4C schematically represents a factor graph applied to the kernel structure schematically shown in FIG. 2C.

As in FIG. 4A, the decoder 120 comprises the LLR computing module 421, the beliefs propagation decoder 422 and the decision maker 423, which together form the decoding part 420 of the decoder 120. The decoder 120 further includes the demultiplexer 410 that converts the estimation b* of the vector b into the estimation b'* of the vector b', from a knowledge of the positions of the frozen bits used by the encoder 110. The LLR computing module 421 outputs the observations $L_x$ (thus in LLR form), which are then used by the beliefs propagation decoder 422 in conjunction with the a priori probabilities $L_b$ (in LLR form too) so as to output the estimates $\hat{L}_b$. The estimates $\hat{L}_b$ are then used by the decision maker 423 so as to determine the estimation b* of the vector b.

The decoder 120 further comprises a configurator 602, as well as a detector 601. The detector 601 is in charge of detecting that a change in BDMC should have implied a change in the D&C structure of the encoder 110. Either the detector 601 detects such a change by monitoring relevant parameters of the BDMC or the detector 601 is informed by the encoder 110 that such a change occurred. The configurator 602 is in charge of configuring the beliefs propagation decoder 422 so that the beliefs propagation decoder 422 takes into account the up-to-date D&C structure of the encoder 110.

Figure 7:
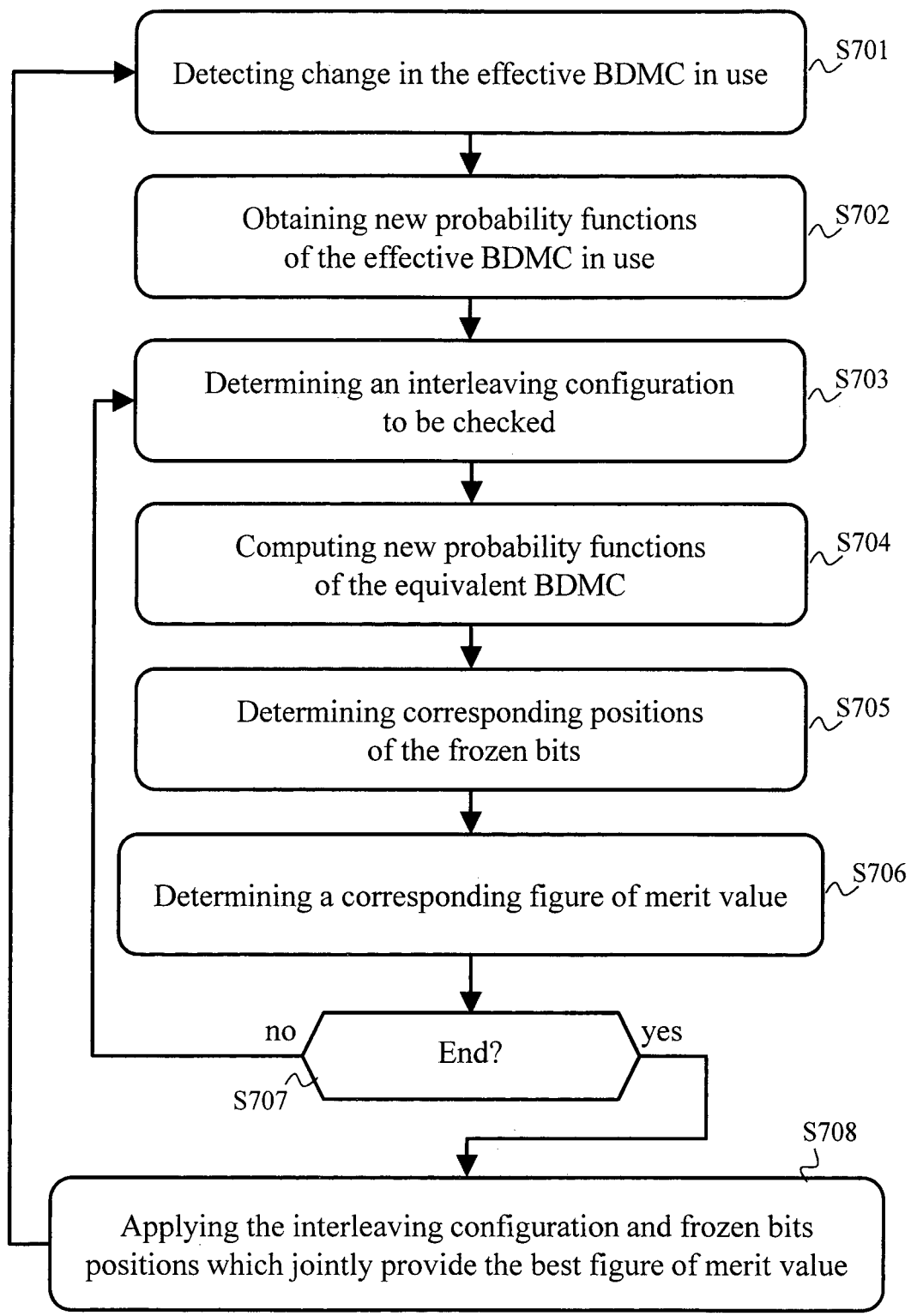
FIG. 7 schematically represents an algorithm for configuring the encoding part according to the present invention.

FIG. 7 schematically represents an algorithm for configuring the polarizer POL-N 220 according to the present invention.

In a step S701, the detector 511 detects that a new configuration of the polarizer POL-N 220 has to be determined and applied. The need for the new configuration of the polarizer POL-N 220 is detected following a change, above a predefined threshold, of the considered parameter of the BDMC, e.g. erasure rate or SNR, wherein said considered parameter of the BDMC is monitored.

In a following step S702, the configurator 512 obtains updated probability functions $p_{1:\mathcal{N}}^{(out)}$, or parameters representative thereof or of numerical approximations thereof, of the effective BDMC in use. When the probability functions $p_{1:\mathcal{N}}^{(out)}$ are obtained from a closed form expression depending on the monitored channel parameters, such as the erasure rate for the BEC or the SNR for the AWGN channel with BPSK input, said parameter can be estimated and tracked through time, for example according to the reception of pilot sequences. As a remark, in this case, only the parameter can be stored and used in the next steps since it fully characterizes $p_{1:\mathcal{N}}^{(out)}$. Thus, it is equivalent to have the parametrized expression of $p_{1:\mathcal{N}}^{(out)}$ and the channel parameter knowledge, or the direct expression of $p_{1:\mathcal{N}}^{(out)}$, while it is simpler to store and use said channel parameter.

When the probability functions $p_{1:\mathcal{N}}^{(out)}$ are estimated numerically, a histogram of the likelihoods can be built through time thanks to pilot sequences sent by the transmitter and known beforehand at the receiver.

In a following step S703, the configurator 512 determines an interleaving configuration, i.e. a set of respective configurations of the interleavers 500 or of the interleavers 501 and 502, to be checked. The configurator 512 is expected to check various configurations of the interleavers 500 or of the interleavers 501 and 502.

According to a particular embodiment, the configurator 512 checks in the scope of the algorithm of FIG. 7 all possible configurations of the interleavers 500 or of the interleavers 501 and 502.

According to another particular embodiment, the configurator 512 checks in the scope of the algorithm of FIG. 7 all configurations of the interleavers 500 or of the interleavers 501 and 502 which are defined in a predefined codebook of interleaving configurations.

According to yet another particular embodiment, the configurator 512 checks in the scope of the algorithm of FIG. 7 a predefined quantity of random configurations of the interleavers 500 or of the interleavers 501 and 502 including the configuration in which all the interleavers are configured to be transparent.

According to yet another particular embodiment, the configurator 512 checks in the scope of the algorithm of FIG. 7 configurations of the interleavers 500 or of the interleavers 501 and 502 using a genetic approach, by considering all possible interleaving configuration input-output association switches. This aspect is detailed hereafter by way of an example with regard to FIG. 8.

Figure 2D:
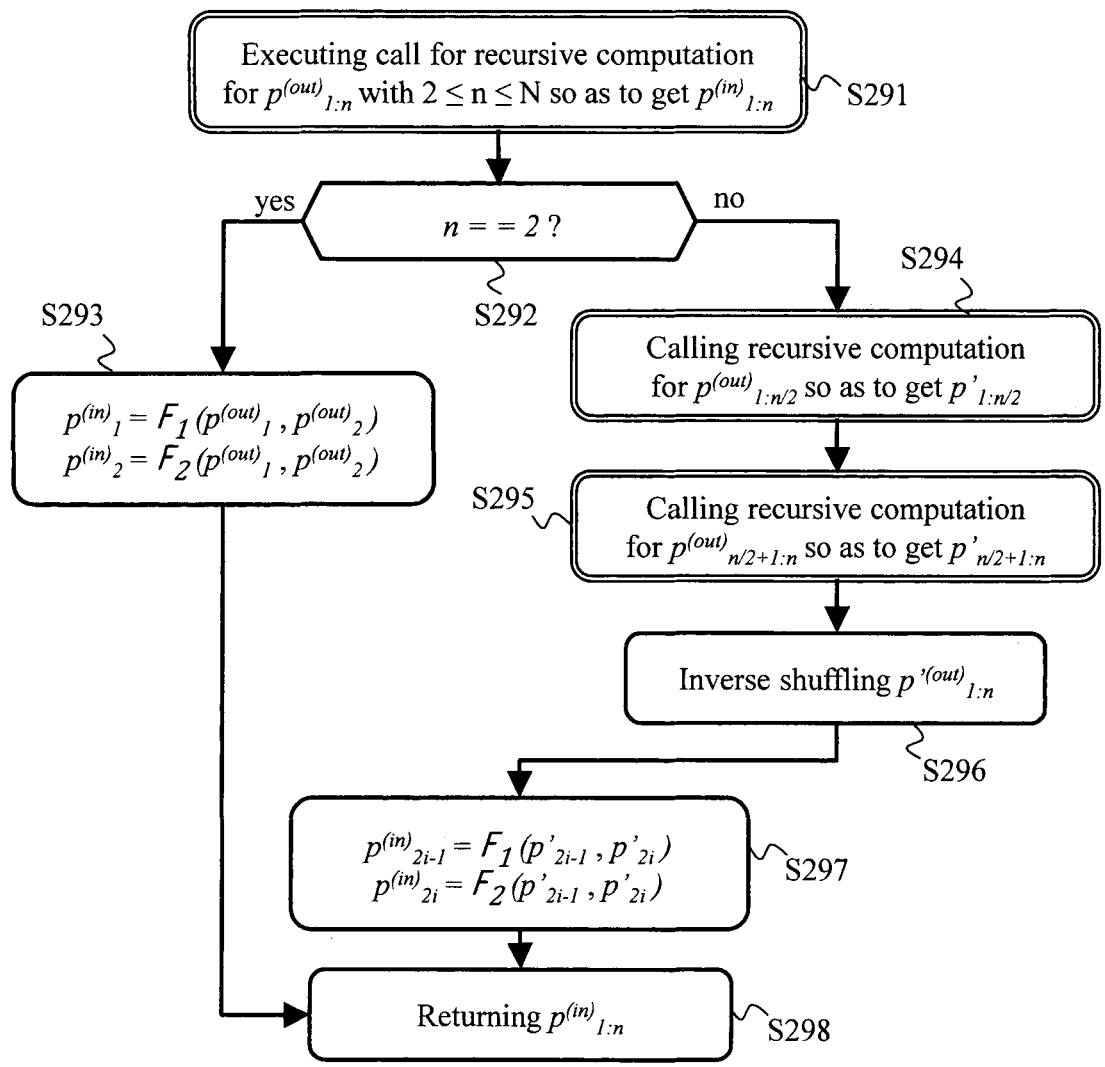
FIG. 2D schematically represents an algorithm for probability functions propagation as used for deciding frozen bits positions according to the prior art.
Figure 3:
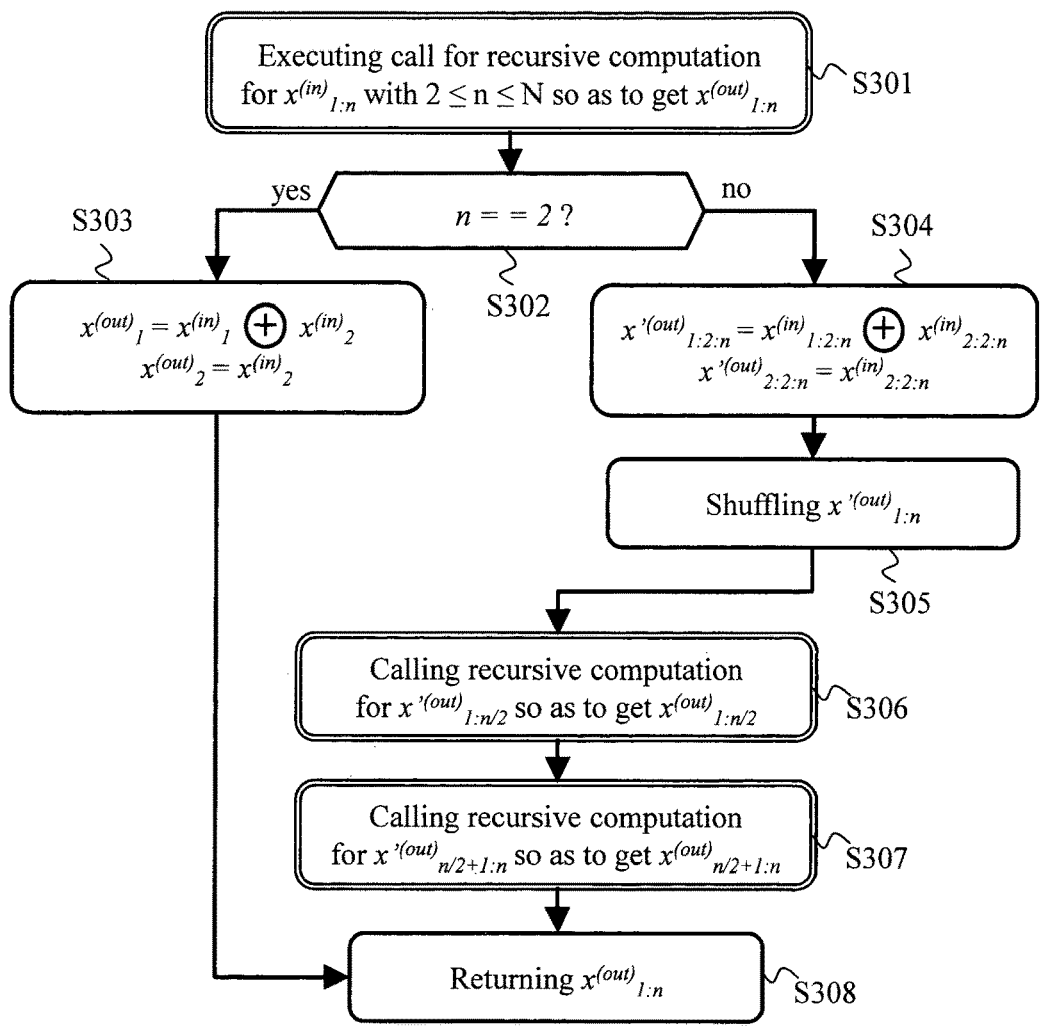
FIG. 3 schematically represents a recursive algorithm for performing encoding according to the modular architecture shown in FIG. 2B.
Figure 9:
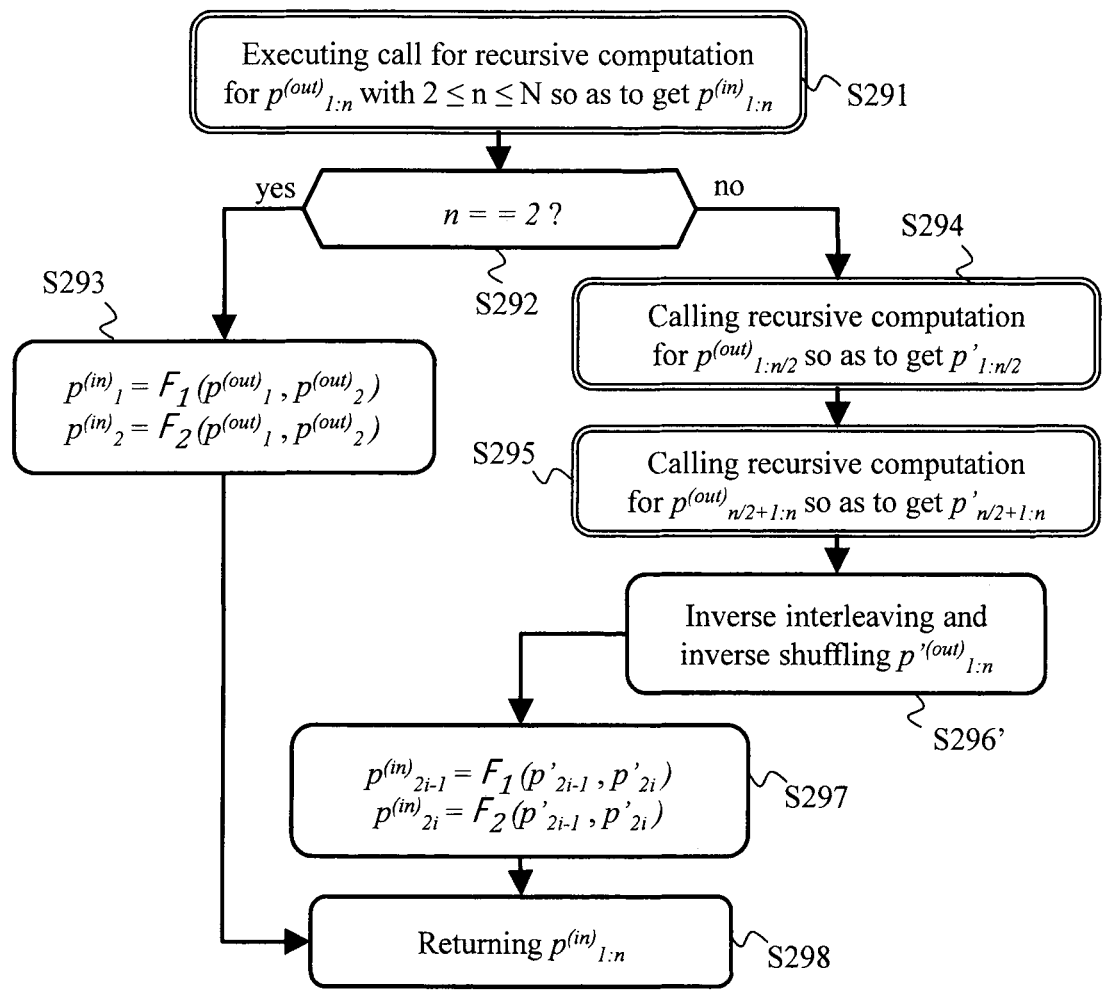
FIG. 9 schematically represents an algorithm for probability functions propagation as used for deciding frozen bits positions according to the present invention.

In a following step S704, the configurator 512 obtains updated probability functions $p_{1:\mathcal{N}}^{(in)}$, or parameters representative thereof or of numerical approximations thereof, of the equivalent BDMC corresponding to the updated probability functions $p_{1:\mathcal{N}}^{(out)}$, or parameters representative thereof or of numerical approximations thereof, obtained in the step S702, by taking into account the D&C structure of the polarizer POL-N 220 as arranged according to the interleaving configuration determined in the step S703. Compared with the algorithm described with regard to FIG. 2D, the step S296 is modified so as to not only take into consideration the shuffling operation performed by the shuffler in question (i.e. the shuffling operation performed by the shuffler of the i-th sub-polarization stage to which corresponds the considered recursion of the algorithm in FIG. 2D) but also of the configuration of each interleaver present in said i-th sub-polarization stage). This aspect is schematically shown in the algorithm in FIG. 9, wherein a step S296' accordingly replaces the step S296 of the algorithm of FIG. 2D.

In a following step S705, the configurator 512 obtains corresponding positions of the frozen bits, by attributing to said frozen bits the virtual BDMCs that are the less reliable with respect to the updated probability functions $p_{1:\mathcal{N}}^{(in)}$, or parameters representative thereof or of numerical approximations thereof, obtained in the step S704.

In a following step S706, the configurator 512 computes a value of a predefined figure of merit that is an estimation representative of performance of data transfer from the encoder 110 to the decoder 120.

According to a first embodiment of the step S706, the figure of merit is mutual information-based and is defined as follows:

$$\sum_{0<j\leq N | F(j)=0} I(x_j^{(in)}; y | x_{1:j-1}^{(in)})$$

wherein $I(x_j^{(in)}; y|x_{1:j-1}^{(in)})$ is the mutual information between the j-th input of the polarization block of size N and the observation vector y, assuming that the values of the inputs $x_{1:j-1}^{(in)}$ are known or correctly decoded. The goal of the optimization performed by the algorithm of FIG. 7 is thus to maximize mutual information. As a remark, the frozen bits are preferably selected according to an ascendant sorting of the mutual information $I(x_j^{(in)}; y|x_{1:j-1}^{(in)})$.

According to a second embodiment of the step S706, the figure of merit is information word decoding success-related and is defined as follows:

$$\prod_{0<j\leq N|F(j)=0} (1 - P_e(x_j^{(in)} | x_{1:j-1}^{(in)}; y))$$

wherein $P_e(x_j^{(in)}|x_{1:j-1}^{(in)}; y)$ represents the decoding success probabilities of the j-th input of the polarizer POL-N 220 and thus $1-P_e(x_j^{(in)}|x_{1:j-1}^{(in)}; y)$ represents the bit error probability of said j-th input of the polarizer POL-N 220. The goal of the optimization performed by the algorithm of FIG. 7 is thus to maximize mutual information. As a remark, the frozen bits are preferably selected according to an ascendant sorting of the bit decoding success probabilities $1-P_e(x_j^{(in)}|x_{1:j-1}^{(in)}; y)$.

In a following step S707, the configurator 512 determines whether there is at least one other interleaving configuration to be checked. If there is at least one other interleaving configuration to be checked, the step S703 is repeated; otherwise, a step S708 is performed.

In the step S708, the configurator 512 retains the interleaving configuration and positions of the frozen bits which jointly provide the best figure of merit value, i.e. the value that shows the best performance of data transfer from the encoder 110 to the decoder 120. The configurator 512 applies the retained interleaving configuration, i.e. configures the interleavers 500 or the interleavers 501 and 502, in accordance with the retained interleaving configuration.

In a particular embodiment, the encoder 110 informs the decoder 120 of the retained interleaving configuration and corresponding positions of the frozen bits. In a variant embodiment, the configurator 602 of the decoder 120 determines the retained interleaving configuration and corresponding positions of the frozen bits by simulation using the same approach than the configurator 512 of the encoder 110. The detector 601 of the decoder 120 may monitor the considered parameter of the BDMC and detect changes in said BDMC on its own. Another approach is that the encoder 110 informs the decoder 120 of the change in the BDMC and supplies to the decoder 120 information representative of the updated probability functions $p_{1:N}^{(out)}$.

Figure 8:
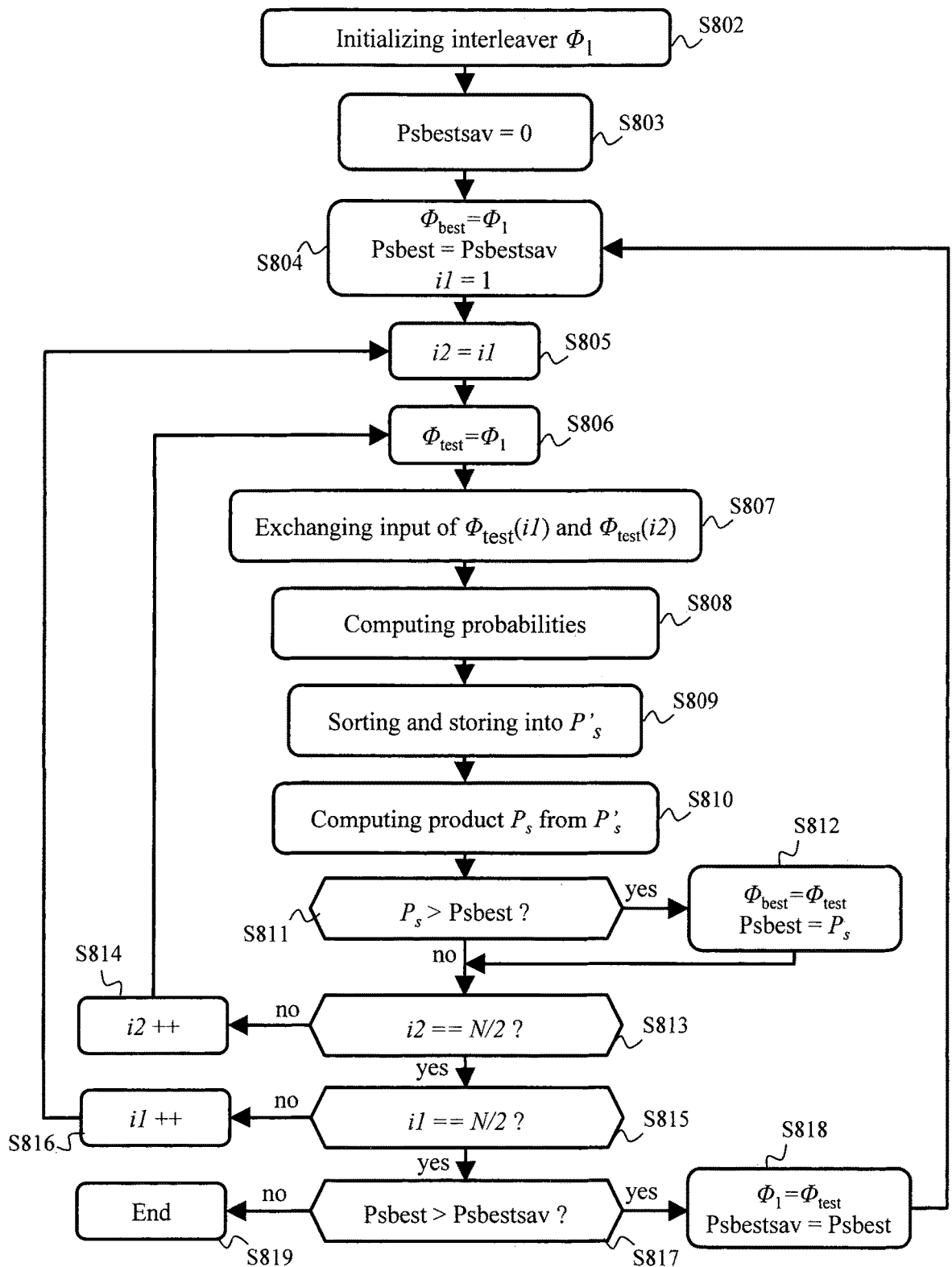
FIG. 8 schematically represents an algorithm for determining, in a genetic approach, an appropriate configuration of the encoding part according to the present invention.

FIG. 8 schematically represents an algorithm for determining, in a genetic approach, an appropriate configuration of the polarizer POL-N 220. For simplicity considerations, FIG. 8 describes how to optimize the interleaving configuration $\phi_1$ by using a genetic approach. The main principle is to test various interleaving configurations, and thus various configurations of the polarizer POL-N 220, by modifying input-output associations in the interleaver identified by the index u=1 (with u defined as explained hereinbefore). Performance evaluation is performed for each tested interleaving configuration by re-computing the probability functions $p_{1:N}^{(in)}$ of the equivalent BDMC, optimizing the frozen bits and re-computing the corresponding value of the figure of merit. All the possible input-output association switches in the interleaving configuration $\phi_1$ are tested, and the configuration of the polarizer POL-N 220 showing the best estimated performance according to the figure of merit is retained and applied. This operation is repeated several times and converges to a sub-optimal solution. However, it allows to obtain a good version of the interleaving configuration in a limited number of tests, which is a key advantage.

In a step S802, the polarizer POL-N 220 initializes the interleaving configuration $\phi_1$, as follows:

$$\forall 0 < i \leq N/2, \phi_1(i)=i$$

which means that the interleaving configuration $\phi_1$ is transparent after initialization.

In a step S803, the polarizer POL-N 220 initializes a local variable Psbestsav to "0".

In a step S804, the polarizer POL-N 220 initializes a local variable $\phi_{best}$ with the content of $\phi_1$, and a local variable Psbest with the content of the local variable Psbestsav. Moreover, the polarizer POL-N 220 sets a first index i1 to "1".

In a step S805, the polarizer POL-N 220 initializes a second index i2 with the value of the first index i1.

In a step S806, the polarizer POL-N 220 initializes a local variable $\phi_{test}$ with the content of $\phi_1$.

In a step S807, the polarizer POL-N 220 exchanges the inputs of $\phi_{test}$ (i1) and $\phi_{test}$ (i2), which means that the input of the interleaving configuration $\phi_{test}$ connected to the output $\phi_{test}$ (i1) is inverted with the input of the interleaving configuration $\phi_{test}$ connected to the output $\phi_{test}$ (i2). A new interleaving configuration is thus obtained, except for the iterations wherein i1=i2. This approach of considering the case where i1=i2 allows testing the configuration in which all and any interleavers are set as transparent (which leads to the D&C structure of the prior art).

In a step S808, the polarizer POL-N 220 computes decoding success probabilities $P_e(x_j^{(in)}|x_{1:j-1}^{(in)}; y)$, $\forall 0 < j \leq N$, according to the interleaving configuration $\phi_{test}$ obtained in the step S807. In other words, the polarizer POL-N 220 computes the decoding success probabilities $P_e(x_j^{(in)}|x_{1:j-1}^{(in)}; y)$ according to the probability functions $p_{1:N}^{(out)}$, according to the functions $\mathcal{F}_1$ and $\mathcal{F}_2$ and according to the interleaving configuration $\phi_{test}$ obtained in the step S807. It means that at least the decoding success probabilities $P_e(x_j^{(in)}|x_{1:j-1}^{(in)}; y)$ for the inputs that have been inverted by the change brought by the interleaving configuration $\phi_{test}$ obtained in the step S807 have to be recomputed, compared with the interleaving configuration $\phi_{est}$ used during the last execution of the step S808.

In a step S809, the polarizer POL-N 220 performs a sorting operation for sorting in descending order the bit decoding success probabilities represented by $1-P_e(x_j^{(in)}|x_{1:j-1}^{(in)}; y)$, $\forall 0 < j \leq N$. The polarizer POL-N 220 then stores in a vector P'$_s$ the results of the sorting operation, which means that P'$_s$(1) stores the highest bit decoding success probability $1-P_e(x_i^{(in)}|x_{1:i-1}^{(in)}; y)$ computed in the step S808 and P'$_s$(N) stores the lowest bit decoding success probability $1-P_e(x_i^{(in)}|x_{1:i-1}^{(in)}; y)$ computed in the step S808.

In a step S810, the polarizer POL-N 220 computes a product value P$_s$ defined as follows:

$$P_s = \prod_{j=1}^{N \cdot R} P'_s(j)$$

which means that only the N·R first entries of the vector P'$_s$ are retained for computing the product value P$_s$, which thus represents the global information word decoding success probability for the N·R best virtual BDMCs obtained with the interleaving configuration $\phi_{test}$ or, in other words, the figure of merit in use corresponds to word decoding success rate.

In a step S811, the polarizer POL-N 220 checks whether the product value P$_s$ is greater than the local variable Psbest.

If the product value $P_s$ is greater than the local variable Psbest, a step S812 is performed; otherwise a step S813 is performed.

In the step S812, the polarizer POL-N 220 stores in the local variable $\phi_{test}$ the contents of the local variable $\phi_{test}$. Furthermore, the polarizer POL-N 220 stores the product value $P_s$ in the local variable Psbest. Then the step S813 is performed.

In the step S813, the polarizer POL-N 220 checks whether the second index i2 is equal to N/2. If the second index i2 is equal to N/2, a step S815 is performed; otherwise, a step S814 is performed.

In the step S814, the polarizer POL-N 220 increments the second index i2 by one unit. Then the step S806 is repeated.

In the step S815, the polarizer POL-N 220 checks whether the first index i1 is equal to N/2. If the first index i1 is equal to N/2, a step S817 is performed; otherwise, a step S816 is performed.

In the step S816, the polarizer POL-N 220 increments the second index i1 by one unit. Then the step S805 is repeated.

In the step S817, the polarizer POL-N 220 checks whether the value stored in the local variable Psbest is greater than the value stored in the local variable Psbestsav, i.e. the polarizer POL-N 220 checks whether the configuration that led to the value stored in the local variable Psbest shows data transfer improvement, with respect to the considered figure of merit, compared with any previously considered interleaving configuration $\phi_1$. If the value stored in the local variable Psbest is greater than the value stored in the local variable Psbestsav, a step S818 is performed; otherwise, a step S819 is performed, in which the algorithm in FIG. 8 ends, which means that the interleaving configuration $\phi_1$ to be applied has been found.

In the step S818, the polarizer POL-N 220 stores the interleaver configuration $\phi_{test}$ test as interleaving configuration $\phi_1$. Furthermore, the polarizer POL-N 220 stores in the local variable Psbestsav the value stored in the local variable Psbest. Then the step S804 is repeated.

In the scope of the algorithm of FIG. 8, the figure of merit illustratively used is word decoding success rate, and the frozen bit optimization is done by selecting the bit positions showing the N·R lowest bit decoding success probabilities with respect to the probability functions $p_{1:N}^{(in)}$. It is possible to use another figure of merit in the scope of FIG. 8 and the principles described here above would remain identical, for example when trying to maximize mutual information.

Figure 10:
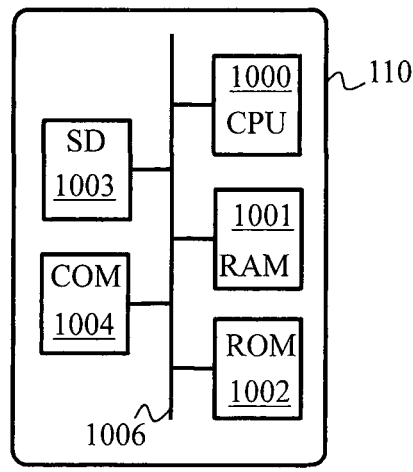
FIG. 10 schematically represents a hardware architecture that may be used to implement the polar code encoder and/or the polar code decoder.

FIG. 10 schematically represents an embodiment of architecture of the encoder 110. According to the shown architecture, the encoder 110 comprises the following components interconnected by a communications bus 1006: a processor, microprocessor, microcontroller or CPU (Central Processing Unit) 1000; a RAM (Random-Access Memory) 1001; a ROM (Read-Only Memory) 1002; an SD (Secure Digital) card reader 1003, or any other device adapted to read information stored on storage means, such as an HDD (Hard Disk Drive); and, a communication interface 1004 toward the decoder 120 via BDMC onto which polar codes are used.

CPU 1000 is capable of executing instructions loaded into RAM 1001 from ROM 1002 or from an external memory, such as an HDD or an SD card. After the encoder 110 has been powered on, CPU 1000 is capable of reading instructions from RAM 1001 and executing these instructions that form one computer program.

Any and all steps performed by the encoder 110 may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit). Similarly, the modular architecture embodiments presented in FIGS. 5A, 5B and 5C may be implemented in software form or in hardware form. In general, the encoder 110 comprises processing electronics circuitry configured for implementing the relevant steps to be performed by the encoder 110 as described herein.

Figure 11:
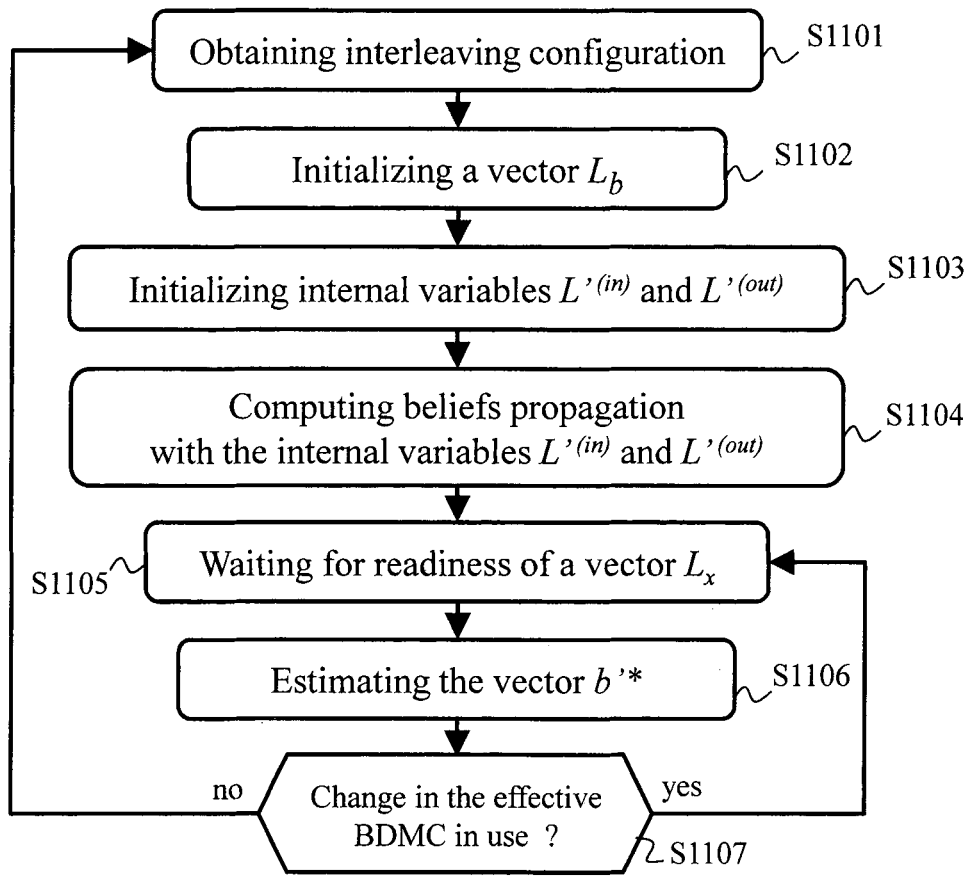
FIG. 11 schematically represents a decoding algorithm according to the present invention.

The behaviour of the decoder 120 according to the invention is schematically shown by the algorithm in FIG. 11.

In a step S1101, the decoder 120 detects that a change in BDMC has implied a change in the D&C structure of the encoder 110. Either the decoder 120 detects such a change on its own by monitoring relevant parameters of the BDMC (similarly as the encoder 110 does) or is informed by the encoder 110, by using a signalling channel, that such a change occurred.

In a step S1102, the decoder 120 initializes the vector $L_b$ first as a null vector, and then the decoder 120 modifies the vector $L_b$ according to the knowledge of the positions of the frozen bits used by the encoder 110, as follows:

$$\forall 0 < j \leq N, F(j)=1 \Rightarrow L_b(j)=+\infty$$

wherein $+\infty$ is numerically represented by a value that is sufficiently high to be out of the scope of the LLR values that can exist at the input of any polarizer of size n, with n being a power of "2" such that $0 < n \leq N/2$. It means that, for any index value that corresponds to a position of a frozen bit in the vector b, the value of the vector $L_b$ at said index value is set to infinity or a default value representative thereof, and set to "0" otherwise.

The decoder 120 is either capable of determining the positions of the frozen bits by simulating what would be computed by the encoder 110 in view of the probability functions $p_{1:n}^{(out)}$, or is informed by the encoder 110, by using the signalling channel, of the selected positions of the frozen bits.

Similarly, the decoder 120 is either capable of determining the interleaving configuration used by the encoder 110 by simulating what would be computed by the encoder 110 in view of the probability functions $p_{1:n}^{(out)}$, or is informed by the encoder 110, by using the signalling channel, of the selected interleaving configuration.

In a following step S1103, the decoder 120 initializes internal variables $L'_{1:N}{}^{(in)}$ and $L'_{1:N}{}^{(out)}$ with null values. Said internal variables are intended to be propagated along the recursions of the beliefs propagation.

Figure 4D:
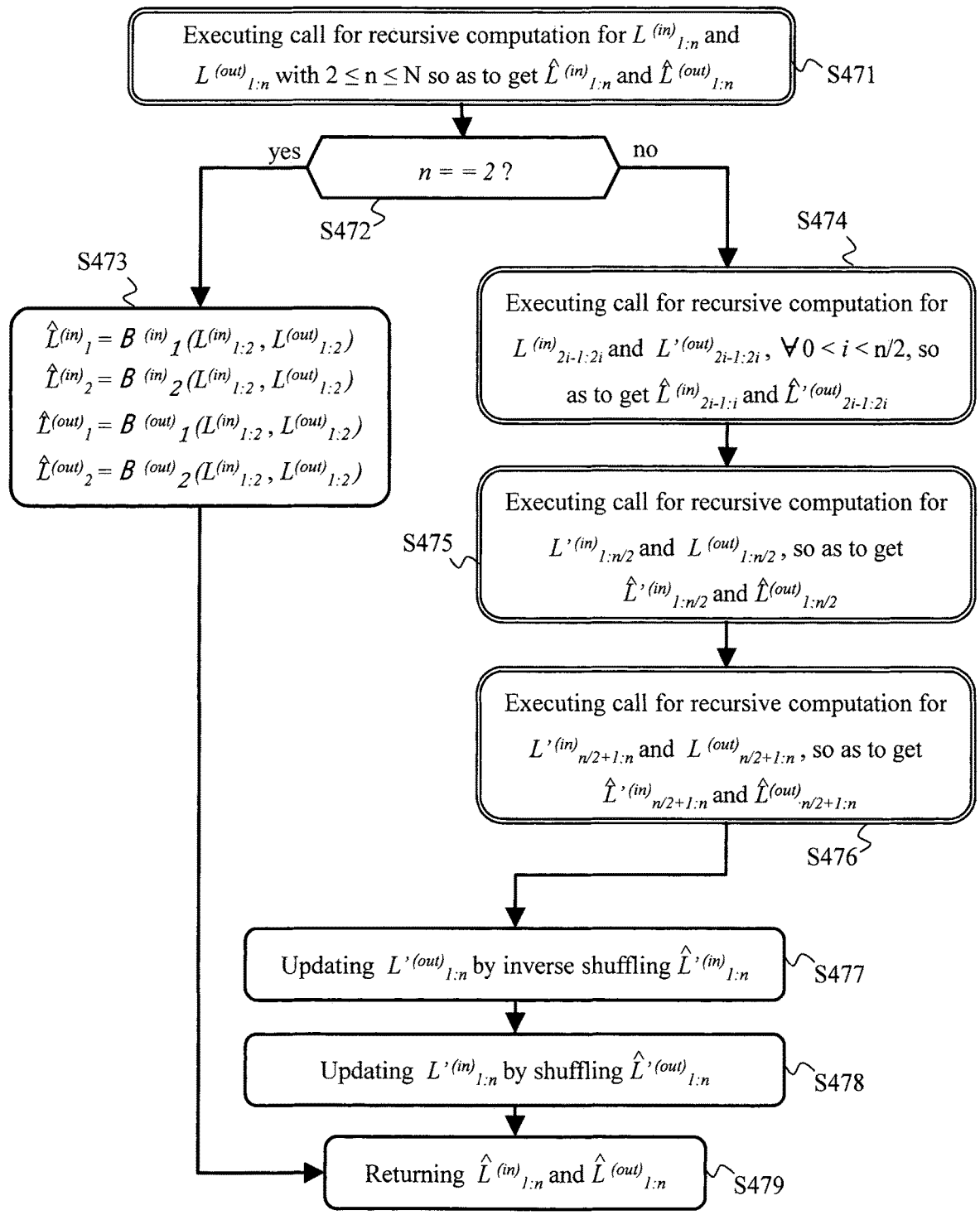
FIG. 4D schematically represents a beliefs propagation algorithm according to the prior art.
Figure 13:
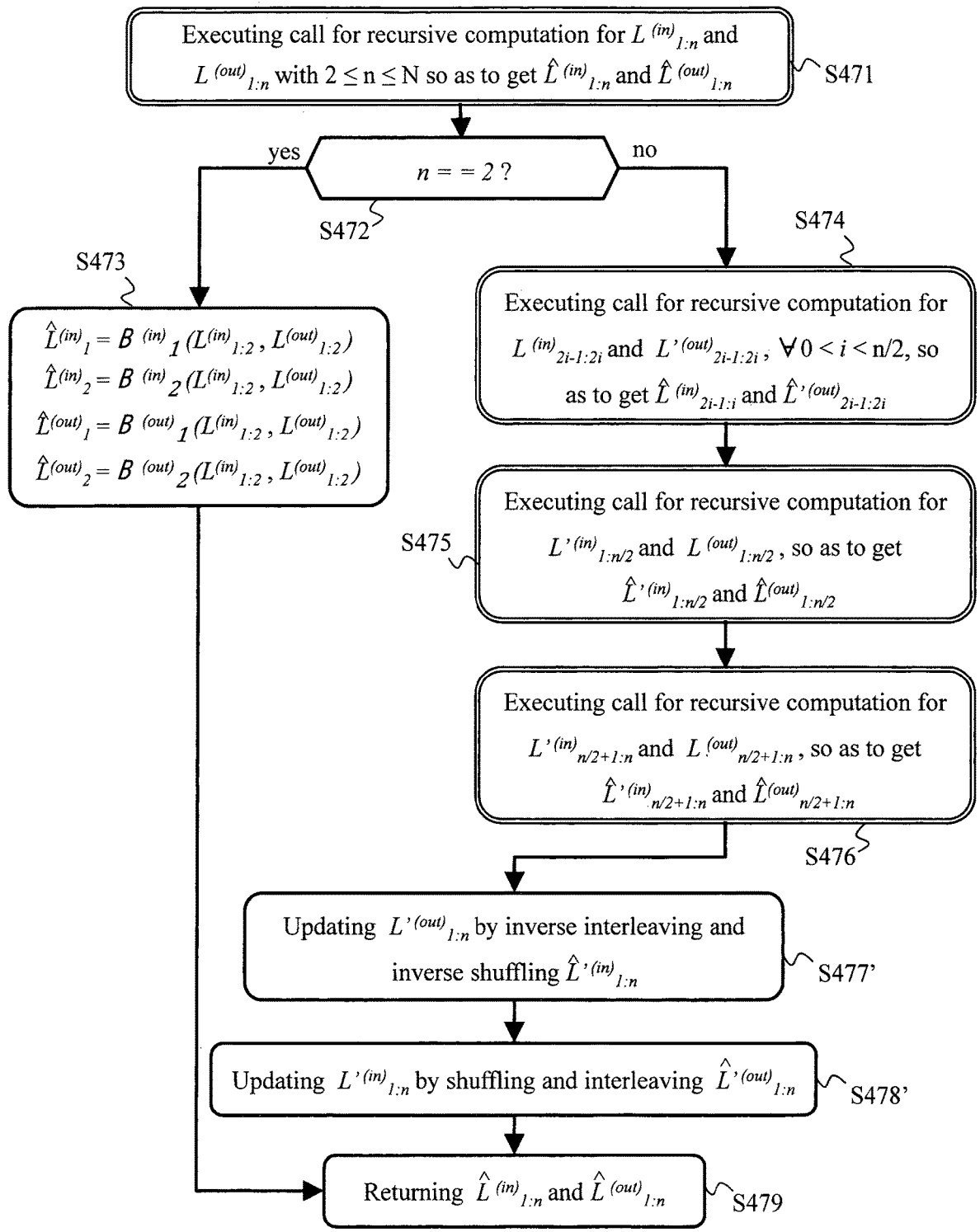
FIG. 13 schematically represents a beliefs propagation algorithm according to the present invention.

In a following step S1104, the decoder 120 computes beliefs propagation using the internal variables $L'_{1:N}{}^{(in)}$ and $L'_{1:N}{}^{(out)}$, according to the known D&C structure of the polarizer POL-N 220, including the interleaving configuration, and to the observations $L_x$ in LLR form. In other words, the decoder 120 uses the algorithm schematically shown in FIG. 13 by inputting therein the vector $L_b$ as $L_{1:N}{}^{(in)}$ and the vector $L_x$ as $L_{1:N}{}^{(out)}$. Compared with the algorithm described with regard to FIG. 4D, the step S477 is modified so as to not only take into consideration the shuffling operation performed by the shuffler in question (i.e. the shuffling operation performed by the shuffler of the i-th sub-polarization stage to which corresponds the considered recursion of the algorithm in FIG. 13) but also of the configuration of each interleaver present in said i-th sub-polarization stage. This aspect is schematically shown in the algorithm in FIG. 13, wherein a step S477' accordingly replaces the step S477 of the algorithm of FIG. 4D. Moreover, compared with the algorithm described with regard to FIG. 4D, the step S478 is also modified so as to not only take into consideration the shuffling operation performed by the shuffler in question (i.e. the shuffling operation performed by the shuffler of the i-th sub-polarization stage to which corresponds the considered recursion of the algorithm in FIG. 13) but also of the configuration of each interleaver present in said i-th sub-polarization stage. This aspect is schematically shown in the algorithm in FIG. 13, wherein a step S478' accordingly replaces the step S478 of the algorithm of FIG. 4D.

The output of the beliefs propagation are the vectors $\hat{L}_b$ and $\hat{L}_x$, wherein the vector $\hat{L}_b$ is then used by the decision maker 423 to determine the estimation b* of the vector b.

In a following step S1105, the decoder 120 waits for availability of observations made on the BDMC and that said observations be made available in LLR form, i.e. the vector $L_x$, by the LLR computing module 421.

In a following step S1106, the decoder 120 has obtained the vector $L_x$ corresponding to an information word, i.e. the vector b, transferred by the encoder 110 using polar coding, and the decoder 120 makes a decision on each bit of the estimation b* of the vector b according to the estimates $L_b$ output by the beliefs propagation decoder 422. The decision is made as follows:

$$\forall 0 < j \leq N, \begin{cases} \hat{L}_b(j) > 0 \Rightarrow \hat{b}(j) = 0 \\ \hat{L}_b(j) < 0 \Rightarrow \hat{b}(j) = 1 \end{cases}$$

$\hat{L}_b(j)$, $\forall 0 < j \leq N$, should not be equal to "0". In case such a situation occurs, the decoder 120 arbitrarily sets the corresponding bit $\hat{b}(j)$ either to "0" or to "1".

Then, since the decoder 120 knows the positions of the frozen bits in the vector b, the decoder is able to extract therefrom the information bits so as to form the estimation b'* of the vector b', which ends the transfer of said information bits from the encoder 110 to the decoder 120 using the polar code approach.

In a following step S1107, the decoder 120 checks whether there is a change in the effective BDMC in use. As already mentioned, the detector 601 may monitor the relevant parameter of the BDMC so as to detect a change in the aforementioned probability functions $p_{1:n}^{(out)}$. In a variant, the detector 601 may be informed by the encoder 110 that a change occurred in the aforementioned probability functions $p_{1:n}^{(out)}$ and consequently in the D&C structure used by the encoder 110 due to reconfiguration of the interleavers included therein. If there is a change in the effective BDMC in use, the step S1101 is repeated; otherwise the step S1105 is repeated for decoding a new information word transferred by the encoder 110 using polar coding.

Figure 12:
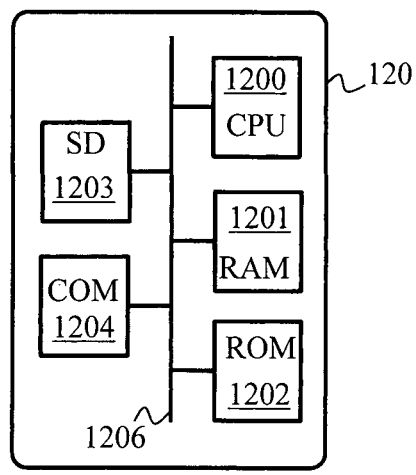
FIG. 12 schematically represents a hardware architecture that may be used to implement the polar code decoder.

FIG. 12 schematically represents an embodiment of architecture of the decoder 120. According to the shown architecture, the decoder 120 comprises the following components interconnected by a communications bus 1006: a processor, microprocessor, microcontroller or CPU 1200; a RAM 1201; a ROM 1202; an SD card reader 1203, or any other device adapted to read information stored on storage means, such as an HDD; and, a communication interface 1204 for receiving communications from the decoder 120 via the BDMC onto which polar codes are used.

CPU 1200 is capable of executing instructions loaded into RAM 1201 from ROM 1202 or from an external memory, such as an HDD or an SD card. After the decoder 120 has been powered on, CPU 1200 is capable of reading instructions from RAM 1201 and executing these instructions that form one computer program.

Any and all steps performed by the decoder 120 may be implemented in software by execution of a set of instructions or program by a programmable computing machine, such as a PC, a DSP or a microcontroller; or else implemented in hardware by a machine or a dedicated component, such as an FPGA or an ASIC. Similarly, the modular architecture embodiments presented in FIG. 6 may be implemented in software form or in hardware form. In general, the decoder 120 comprises processing electronics circuitry configured for implementing the relevant steps to be performed by the decoder 120 as described herein.

The invention claimed is:

1. A method for configuring a Divide and Conquer structure of a polar-code based encoder performing a transfer of useful data to a polar-code based decoder via a Binary Discrete-input Memory-less Channel, the method being performed by the polar-code based encoder, the Divide and Conquer structure consisting of a multiplexer followed by a polarization block of size $N=2^L$, the multiplexer having useful data bits and a set of frozen bits as inputs so as to form input data $x_{1:N}^{(in)}$, wherein the polarization block of size N comprises a set of front kernels followed by a shuffler and two complementary polarization sub-blocks of size N/2 with a similar structure as the polarization block of size N but with half its size, wherein the shuffler distributes its odd entries to one of the complementary polarization sub-blocks and its even entries to the other one of the complementary polarization sub-blocks, such that the Divide and Conquer structure is recursive with a depth equal to L, wherein a dynamically configurable interleaver is present between the shuffler and one and/or the other of the complementary polarization sub-blocks at each recursion of the Divide and Conquer structure, and in that the method comprises:
  detecting change in the Binary Discrete-input Memory-less Channel;
  obtaining probability functions $p_{1:N}^{(out)}$, which characterize channel transitions probabilities of the Binary Discrete-input Memory-less Channel at output of the polarization block of size N, according to the detected change in the Binary Discrete-input Memory-less Channel;
  computing probability functions $p_{1:N}^{(in)}$, which characterize channel transitions probabilities of an equivalent Binary Discrete-input Memory-less Channel at input of the polarization block of size N, from the obtained probability functions $p_{1:N}^{(out)}$ for a set of interleaving configurations of the dynamically configurable interleavers, determining corresponding positions of the frozen bits and determining a corresponding figure of merit value, wherein the figure of merit is an estimation representative of performance of the transfer to the polar-code based decoder via the Binary Discrete-input Memory-less Channel; and
  selecting and applying the interleaving configuration of the dynamically configurable interleavers which shows the best performance of the transfer to the polar-code based decoder via the Binary Discrete-input Memory-less Channel in view of the determined corresponding figure of merit values.

2. The method according to claim 1, wherein the figure of merit is mutual information-based and is defined as follows:

$$\sum_{0<j\leq N|F(j)=0} I(x_j^{(in)}; y | x_{1:j-1}^{(in)})$$

wherein $I(x_j^{(in)}; y|x_{1:j-1}^{(in)})$ is the mutual information between the j-th input $x_j^{(in)}$ of the polarization block of size N and an observation vector y, assuming that the values of the inputs $x_{1:j-1}^{(in)}$ are known or correctly decoded, and wherein F is an N-long vector indicating the positions of the frozen bits at corresponding entries set to '1'.

3. The method according to claim 1, wherein the figure of merit is information word decoding success-related and is defined as follows:

$$\prod_{0<j\leq N|F(j)=0} (1 - P_e(x_j^{(in)} | x_{1:j-1}^{(in)}; y))$$

wherein $P_e(x_j^{(in)}|x_{1:j-1}^{(in)};y)$ represents decoding success probability of the j-th input $x_j^{(in)}$ of the polarization block of size N and thus $1-P_e(x_j^{(in)}|x_{1:j-1}^{(in)};y)$ represents the bit error probability for said j-th input $x_j^{(in)}$ of the polarization block of size N, and wherein F is an N-long vector indicating the positions of the frozen bits at corresponding entries set to '1'.

4. The method according to claim 1, wherein the set of interleaving configurations of the dynamically configurable interleavers is defined using a genetic approach, by considering all possible interleaving configuration input-output association switches.

5. The method according to claim 1, wherein the set of interleaving configurations of the dynamically configurable interleavers gathers all interleaving configurations made possible by the dynamically configurable interleavers.

6. The method according to claim 1, wherein the set of interleaving configurations of the dynamically configurable interleavers consists of a predefined codebook of interleaving configurations.

7. The method according to claim 1, wherein the set of interleaving configurations of the dynamically configurable interleavers consists of a predefined quantity of random configurations of the dynamically configurable interleavers.

8. The method according to claim 1, wherein the Binary Discrete-input Memory-less Channel is a Binary Erasure Channel modelled by relying on erasure rate as parameter monitored to obtain the probability functions $p_{1:N}^{(out)}$.

9. The method according to claim 1, wherein the Binary Discrete-input Memory-less Channel is an Additive White Gaussian Noise channel over which a Binary Phase Shift Keying modulation is used and modelled by relying on Signal-to-Noise Ratio as parameter monitored to obtain the probability functions $p_{1:N}^{(out)}$.

10. A method for performing a transfer of useful data from a polar-code based encoder to a polar-code based decoder via a Binary Discrete-input Memory-less Channel, the polar-code based encoder including a Divide and Conquer structure consisting of a multiplexer having useful data bits and a set of frozen bits as inputs followed by a polarization block of size N=$2^L$, wherein the polar-code based encoder performs the method according to claim 1 and wherein the polar-code based decoder performs:

detecting change in the Binary Discrete-input Memory-less Channel;

obtaining an interleaving configuration dynamically defined by the polar-code based encoder according to the detected change in the Binary Discrete-input Memory-less Channel;

configuring a beliefs propagation decoder according to the obtained interleaving configuration;

wherein the beliefs propagation decoder thus configured is implemented in the polar-code based decoder, so as to decode observations made by said polar-code based decoder via the Binary Discrete-input Memory-less Channel during the transfer of useful data from a polar-code based encoder.

11. The method according to claim 10, wherein the polar-code based decoder obtains the interleaving configuration by simulating, in view of the probability functions $p_{1:N}^{(out)}$, the behaviour of the polar-code based encoder 110 when dynamically determining the interleaving configuration to be applied.

12. A computer program wherein it comprises program code instructions which can be loaded in a programmable device for implementing the method according to claim 1, when the program code instructions are run by the programmable device.

13. Non-transitory information storage medium, wherein it stores a computer program comprising program code instructions which can be loaded in a programmable device for implementing the method according to claim 1, when the program code instructions are run by the programmable device.

14. A polar-code based encoder intended to perform a transfer of useful data to a polar-code based decoder via a Binary Discrete-input Memory-less Channel, the polar-code based encoder including a Divide and Conquer structure consisting of a multiplexer having useful data bits and a set of frozen bits as inputs followed by a polarization block of size N=$2^L$, wherein the polarization block of size N comprises a set of front kernels followed by a shuffler and two complementary polarization sub-blocks of size N/2 with a similar structure as the polarization block of size N but with half its size, wherein the shuffler distributes its odd entries to one of the complementary polarization sub-blocks and its even entries to the other one of the complementary polarization sub-blocks, such that the Divide and Conquer structure is recursive with a depth equal to L, wherein a dynamically configurable interleaver is present between the shuffler and one and/or the other of the complementary polarization sub-blocks at each recursion of the Divide and Conquer structure, and in that the polar-code based encoder further comprises:

means for detecting change in the Binary Discrete-input Memory-less Channel;

means for obtaining probability functions $p_{1:N}^{(out)}$, which characterize channel transitions probabilities of the Binary Discrete-input Memory-less Channel at output of the polarization block of size N, according to the detected change in the Binary Discrete-input Memory-less Channel;

means for computing probability functions $p_{1:N}^{(out)}$, which characterize channel transitions probabilities of an equivalent Binary Discrete-input Memory-less Channel at input of the polarization block of size N, from the obtained probability functions $p_{1:N}^{(out)}$ for a set of interleaving configurations of the dynamically configurable interleavers, determining corresponding positions of the frozen bits and determining a corresponding figure of merit value, wherein the figure of merit is an estimation representative of performance of the transfer to the polar-code based decoder via the Binary Discrete-input Memory-less Channel; and means for selecting and applying the interleaving configuration of the dynamically configurable interleavers which shows the best performance of the transfer to the polar-code based decoder via the Binary Discrete-input Memory-less Channel in view of the determined corresponding figure of merit values.

15. A system including a polar-code based encoder and a polar-code based decoder, the polar-code based encoder being intended to perform a transfer of useful data to the polar-code based decoder via a Binary Discrete-input Memory-less Channel, the polar-code based encoder including a Divide and Conquer structure consisting of a multiplexer having useful data bits and a set of frozen bits as inputs followed by a polarization block of size $N=2^L$, wherein the polar-code based encoder is according to claim 14 and wherein the polar-code based decoder comprises:

means for detecting change in the Binary Discrete-input Memory-less Channel;

means for obtaining an interleaving configuration dynamically defined by the polar-code based encoder according to the detected change in the Binary Discrete-input Memory-less Channel;

means for configuring a beliefs propagation decoder according to the obtained interleaving configuration;

wherein the beliefs propagation decoder thus configured is implemented in the polar-code based decoder, so as to decode observations made by said polar-code based decoder via the Binary Discrete-input Memory-less Channel during the transfer of useful data from a polar-code based encoder.

* * * * *